(12) United States Patent
Tanaka et al.

(10) Patent No.: US 10,896,876 B2
(45) Date of Patent: Jan. 19, 2021

(54) SEMICONDUCTOR DEVICE

(71) Applicant: RENESAS ELECTRONICS CORPORATION, Tokyo (JP)

(72) Inventors: Tomoyuki Tanaka, Tokyo (JP); Takahiro Nakamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/653,164

(22) Filed: Oct. 15, 2019

(65) Prior Publication Data
US 2020/0176374 A1 Jun. 4, 2020

(30) Foreign Application Priority Data
Dec. 4, 2018 (JP) ................................. 2018-227244

(51) Int. Cl.
*H03F 3/45* (2006.01)
*H01L 23/528* (2006.01)
*H03G 3/30* (2006.01)

(52) U.S. Cl.
CPC ....... *H01L 23/528* (2013.01); *H03F 3/45475* (2013.01); *H03G 3/30* (2013.01); *H03F 2200/372* (2013.01); *H03G 2201/103* (2013.01)

(58) Field of Classification Search
CPC .................................. H03F 3/45; H03F 3/187
USPC .................................................. 330/253, 307
See application file for complete search history.

(56) References Cited

U.S. PATENT DOCUMENTS

| 6,794,904 B2 * | 9/2004 | Ooishi ................... G11C 5/147 |
| | | 326/101 |
| 2015/0263175 A1 * | 9/2015 | Koyama .................. G11C 7/12 |
| | | 365/189.09 |
| 2016/0172383 A1 * | 6/2016 | Nagatsuka .......... H01L 27/1255 |
| | | 257/43 |

FOREIGN PATENT DOCUMENTS

JP        2016-219916 A       12/2016

* cited by examiner

Primary Examiner — Henry Choe
(74) Attorney, Agent, or Firm — McDermott Will & Emery LLP

(57) ABSTRACT

In a semiconductor device having a variable gain amplifier, a setting error of a gain associated with a crosstalk noise is reduced. A switch block included in the variable gain amplifier includes a plurality of switch transistors Mp1, Mp2, MN1, and Mn2, and can variably set the parallel number of the switches used for coupling by selecting a forward coupling state for coupling the common wirings CSP, CSN to output wirings OUTP, OUTN, respectively, or a cross coupling state for coupling to OUTN, OUTP, respectively. Output wirings OUTN, OUTP form an output wiring pair by extending in a X direction while crossing each other through an underlying wiring layer ML[x-1]. At least one of the common wirings CSP, CSN is located next to the output wiring pair in a Y direction.

20 Claims, 29 Drawing Sheets

Mp1,Mn1 : On
Mp2,Mn2 : Off

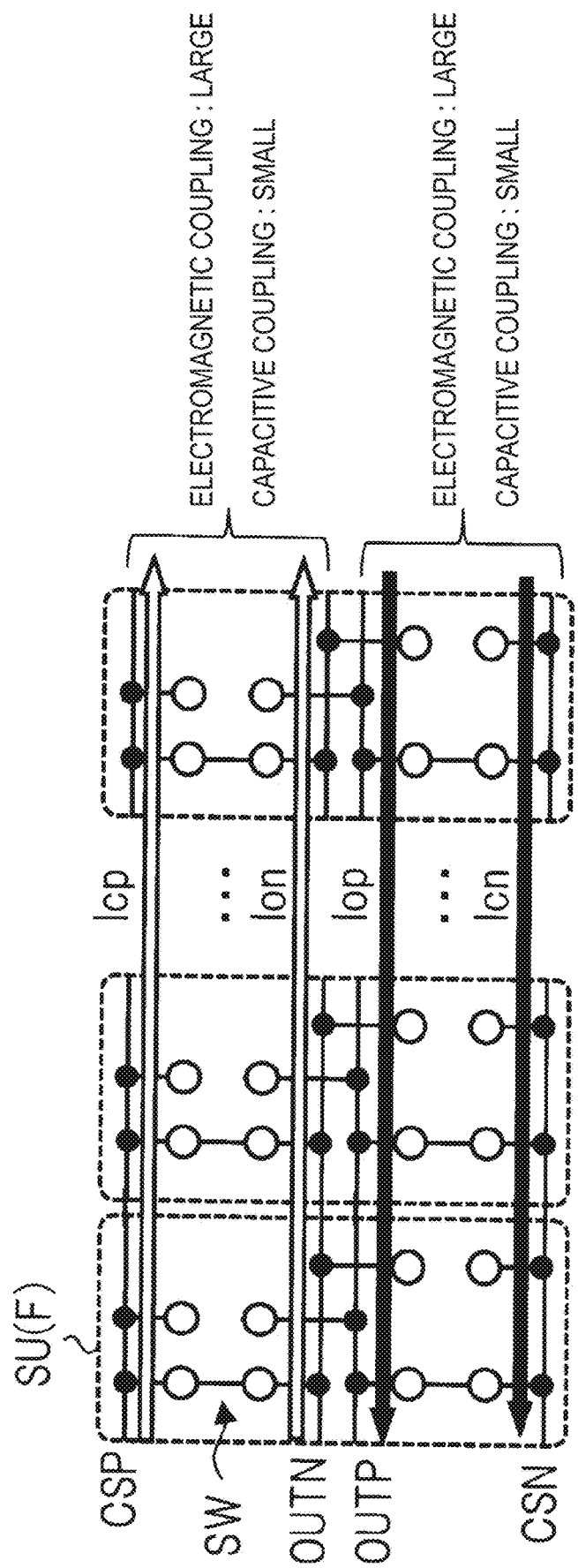

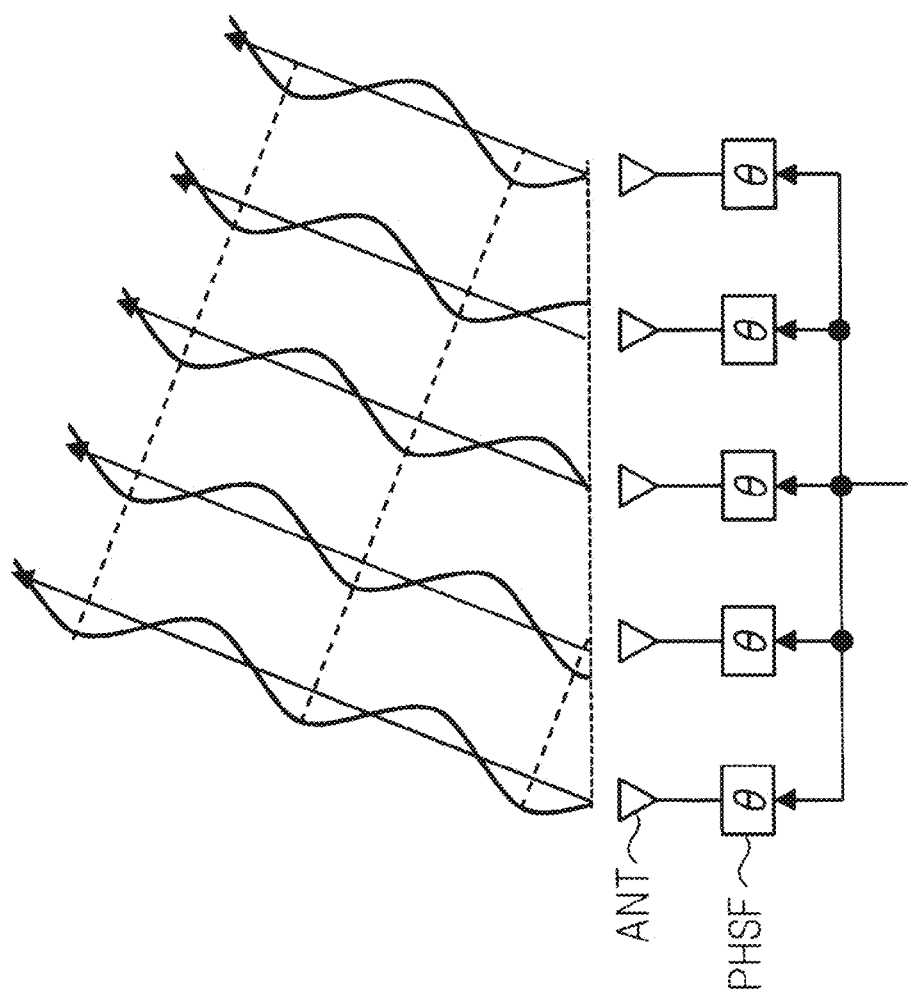

SEMICONDUCTOR DEVICE

CROSS-REFERENCE TO RELATED APPLICATIONS

The disclosure of Japanese Patent Application No. 2018-227244 filed on Dec. 4, 2018 including the specification, drawings and abstract is incorporated herein by reference in its entirety.

BACKGROUND

The present disclosure relates to a semiconductor device, for example, to a semiconductor device with a variable gain amplifier. Japanese unexamined Patent Application publication No. 2016-219916 discloses a phase shifter of a vector synthesis type capable of reducing a setting error of the amount of phase caused by a capacitance between drain and source of a transistor. Specifically, a transistor ($M_{n2}$) to which a desired signal having a phase difference of 0 degrees, 180 degrees, 90 degrees, and 270 degrees is input, a transistor ($M_{n1}$) connected in cascode connection to the transistor ($M_{n2}$) and a control voltage is applied, and a transistor ($M_{n3}$) connected between a drain and a source of the transistor ($M_{n2}$) and controlled complementarily to the transistor ($M_{n1}$) are provided.

SUMMARY

For example, as shown in the Japanese unexamined Patent Application publication No. 2016-219916, a phase shifter of vector synthesis type in which a vector on I axis (0 degrees, 180 degrees) and a vector on Q axis (90 degrees, 270 degrees) are synthesized to variably control a phase of an input signal is known. The size of the vector on I axis and the size of the vector on Q axis are determined based on a gain of variable gain amplifier. For example, in the structure disclosed in the Japanese unexamined Patent Application publication No. 2016-219916, a gain is determined by controlling a bias voltage of a transistor ($M_{n2}$) to which desired signal is input. As another method for determining a gain, a method of variably controlling a size of a transistor or the like can be cited. On the other hand, an actual layout configuration of the variable gain amplifier includes a plurality of input wirings and output wirings that extend side-by-side in one direction. Such input wirings and output wirings can be relatively long in wiring length, particularly when using a scheme to variably control a size of a transistor as described above. As a result, a crosstalk noise between the wires increases, and a setting error of the gain and thus a setting error of the phase may increase. The embodiments described below have been made in view of the above, and other problems and novel features will be apparent from the description of the present specification and the accompanying drawings. The semiconductor device according to an embodiment has differential pair transistors, a first and second output wiring for transmitting differential output signals, and a switch block. The differential pair transistors are coupled between a tail node and first and second common wirings, respectively, and differential input signals are input. The switch block includes a plurality of switch transistors for selecting a forward coupling state to couple the first and second common wirings to the first and second output wirings, respectively, and a cross coupling state to couple the second and first output wirings, respectively, so that the parallel number of the switch transistors used in the coupling can be set variable. Here, the first and second common wirings and the first and second output wirings are arranged side by side in a first direction in a predetermined wiring layer and extend in a second direction crossing the first direction. The first output wiring and the second output wiring form an output wiring pair by extending in the second direction while crossing each other through a wiring layer that differs from the predetermined wiring layer. At least one of the first or second common wiring is arranged adjacent to the output wiring pair in the first direction. According to the above-mentioned embodiment, in the semiconductor device having the variable gain amplifier, the setting error of the gain associated with the crosstalk noise can be reduced.

BRIEF DESCRIPTION OF THE DRAWINGS

FIG. 5A is a diagram showing a main cause of a crosstalk noise that occurs at the time of forward coupling state in FIG. 15A.

FIG. 12B is a schematic diagram showing an exemplary operation of FIG. 12A.

DETAILED DESCRIPTION

Figure 1A:
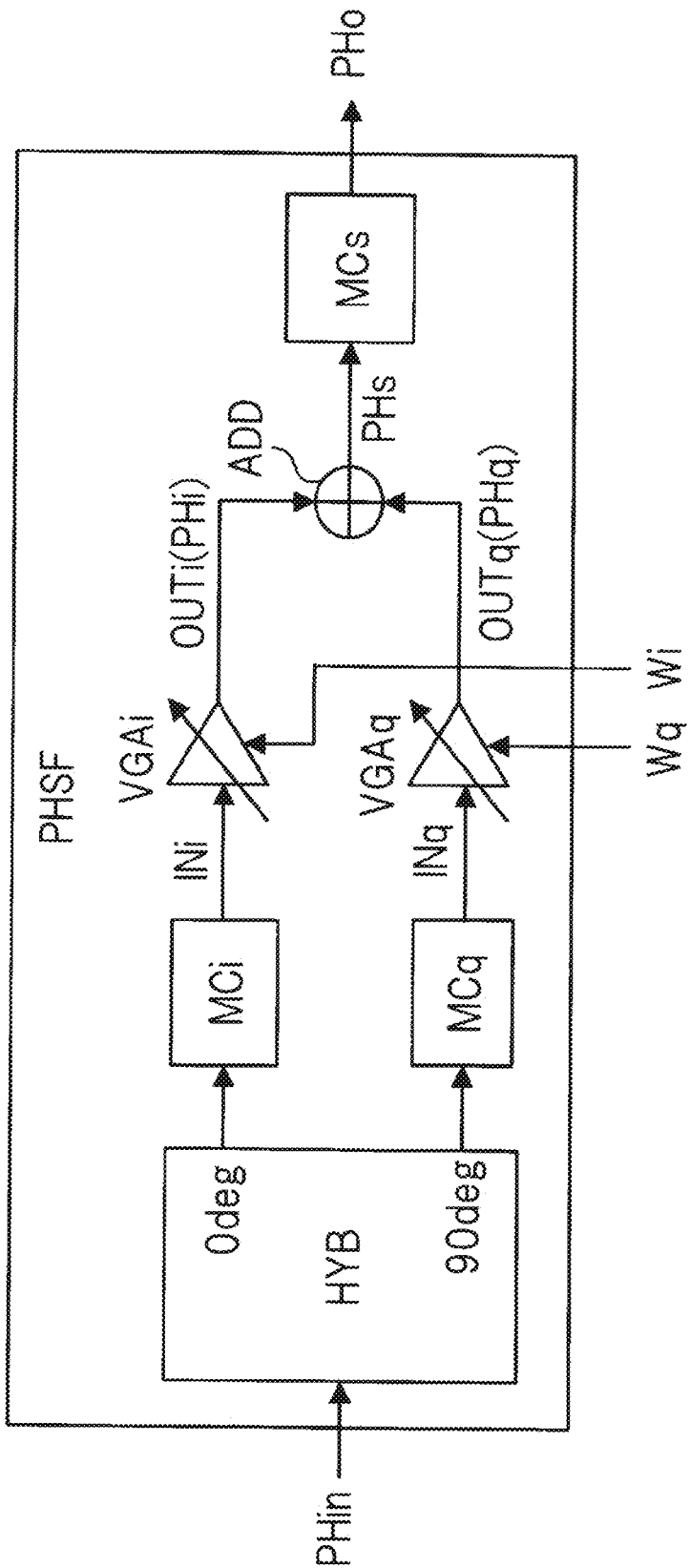
FIG. 1A is a schematic diagram showing an exemplary configuration of a semiconductor device according to a first embodiment.

In the following embodiments, when required for convenience, the description will be made by dividing into a plurality of sections or embodiments, but except when specifically stated, these sections and embodiments are not independent of each other, and one is related to the modified example, detail, supplementary description, or the like of part or all of the other. In the following embodiments, the number of elements or the like (including the number, quantity, range, and the like) is not limited to the specific number except the case where it is specified in particular or the case where it is obviously limited to the specific number in principle, and may be a specific number or more or less.

Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, the same members are denoted by the same reference numerals in principle, and repetitive descriptions thereof are omitted.

First Embodiment

Configuration of the Semiconductor Device

Figure 1B:
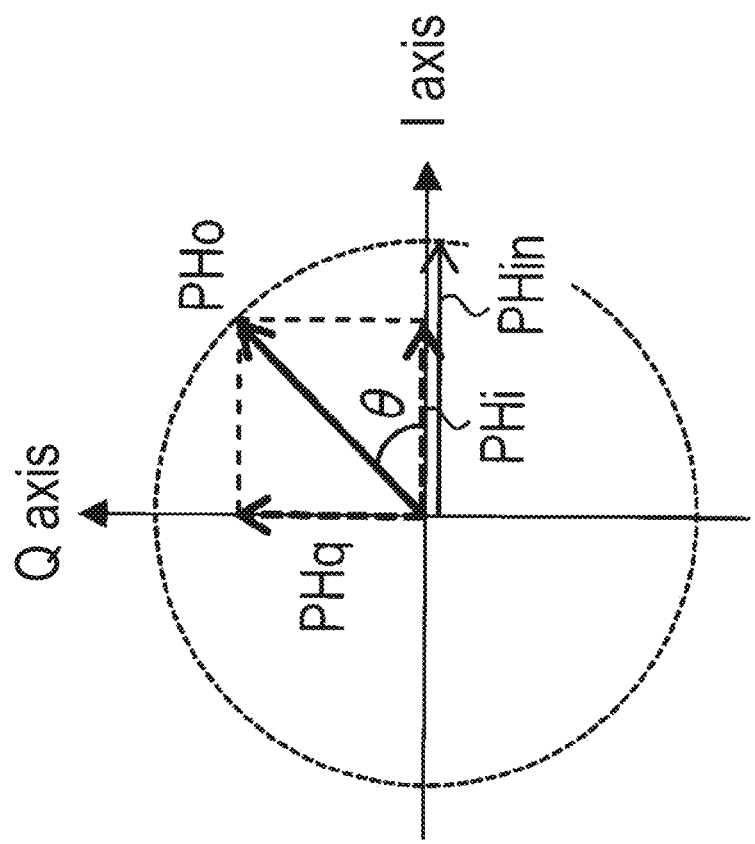
FIG. 1B is a schematic diagram showing an exemplary operation of FIG. 1A.

FIG. 1A is a schematic diagram showing an exemplary configuration of the semiconductor device according to a first embodiment, and FIG. 1B is a schematic diagram showing an exemplary operation of FIG. 1A. The semiconductor device of the first embodiment has a phase shifter PHSF of vector synthesis type as shown in FIG. 1A. The phase shifter PHSF is composed of one semiconductor chip such as MMIC (Monolithic Microwave Integrated Circuit), for example. The phase shifter PHSF has a hybrid coupler circuit HYB, impedance matching circuits MCi, MCq, and MC, variable gain amplifiers VGAi and VGAq, and a synthesizer ADD.

The hybrid coupler circuit HYB receives an input signal PHin to the phase shifter PHSF and generates an I signal having the same phase (0° phase) as the phase of the input signal PHin and a Q signal having a phase that differs by 90° from the phase of the input signal PHin. The variable gain amplifier VGAi receives the I signal from the hybrid coupler circuit HYB as an I-side input signal INi through the impedance matching circuit MCi. The variable gain amplifier VGAq receives the Q signal from the hybrid coupler circuit HYB as a Q-side input signal INq through the impedance matching circuit MCq.

The variable gain amplifier VGAi amplifies the I-side input signal INi by a gain corresponding to a gain setting signal Wi. The variable gain amplifier VGAq amplifies the Q-side input signal INq with a gain corresponding to a gain setting signal Wq. The synthesizer ADD synthesis (specifically vector addition) the I-side output signal OUTi (I-vector signal PHi) from the variable gain amplifier VGAi and the Q-side output signal OUTq (Q-vector signal PHq) from the variable gain amplifier VGAq to generate a synthetic vector signal PHs. The impedance matching circuit MCs transmits the synthetic vector signal PHs outside as an output signal PHo from the phase shifter PHSF.

Here, as shown in FIG. 1B, the I-vector signal PHi from the variable gain amplifier VGAi corresponds to a vector on an I axis on the IQ plane, and the magnitude of the vector is determined by the gain (gain setting signal Wi) of the variable gain amplifier VGAi. On the other hand, the Q-vector signal PHq from the variable gain amplifier VGAq corresponds to a vector on the Q axis on the IQ plane, and the magnitude of the vector is determined by the gain (gain setting signal Wq) of the variable gain amplifier VGAq. By appropriately controlling the magnitude of the vector on the I axis and the magnitude of the vector on the Q axis and vector-adding both vectors, the output signal PHo having an arbitrary phase θ can be generated with reference to the input signal PHin.

The input signal PHin is a millimeter wave signal or a quasi-millimeter wave signal, and in this example, the input signal is a millimeter wave signal in 79 GHz band. Generally, a millimeter wave signal is a signal having a wavelength of 1 mm to 10 mm and a frequency of 30 GHz to 300 GHz, and a quasi-millimeter wave signal is a signal having a wavelength of 10 mm to 15 mm and a frequency of 20 GHz to 30 GHz.

Details of the Variable Gain Amplifier

Figure 2:
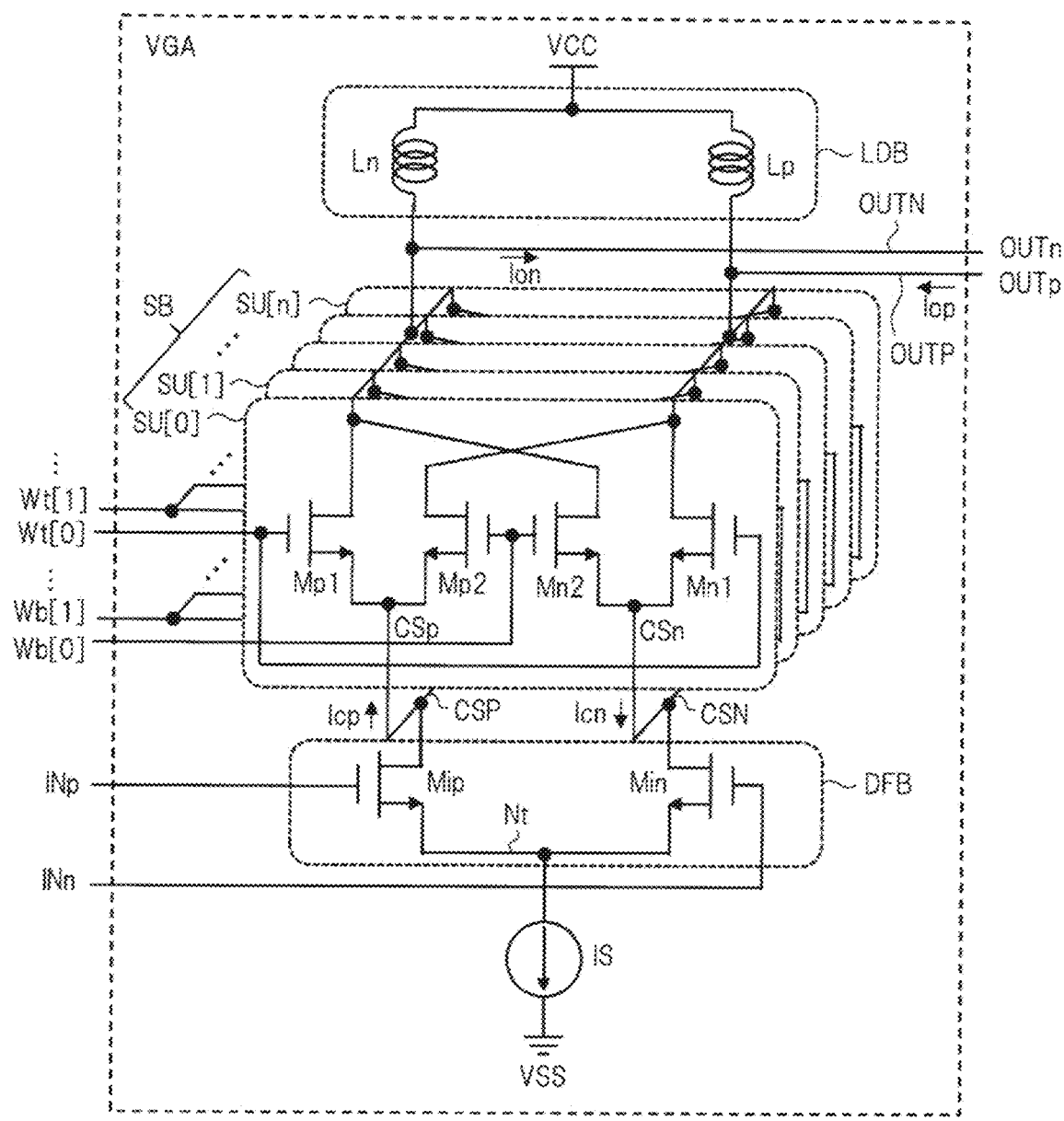
FIG. 2 is a circuit diagram showing an exemplary configuration of the variable gain amplifier of FIG. 1.

FIG. 2 is a circuit diagram showing an exemplary configuration of the variable gain amplifier in FIG. 1. The variable gain amplifier VGA shown in FIG. 2 corresponds to each of the variable gain amplifiers VGAi and VGAq shown in FIG. 1. In this instance, the variable gain amplifier VGA has a differential configuration. Accordingly, an input signal (e.g., I-side input signal INi) to the variable gain amplifier shown in FIG. 1 becomes a differential input signals INp and INn, and output signals (e.g., I-side output signal OUTi) from the variable gain amplifier becomes differential output signals OUTp, OUTn.

The variable gain amplifier VGA shown in FIG. 2 includes a current source IS, a differential input block DFB, a switch block SB, and a load block LDB. The current source IS is coupled between a tail node Nt and a reference power supply voltage Vss. The differential input block DFB has differential pair transistors Mip, Min to which the differential input signals INp, INn is input. The differential pair transistors Mip, Min are formed on a main surface of a semiconductor substrate (not shown). That is, the respective gates of the differential pair transistors Mip, Min are formed on the main surface of the semiconductor substrate through a gate insulating film (not shown). A diffusing layer (not shown) constituting each of the source and drain of the differential pair transistors Mip, Min is formed in the semiconductor substrate.

The differential pair transistors Mip, Min are coupled between the tail node Nt and a common wiring CSP of a positive electrode side, and a common wiring CSN of a negative electrode side, respectively. Specifically, the differential input signals INp, INn are input to respective gates of the differential pair transistors Mip and Min. The sources of the differential pair transistors Mip, Min are coupled to the current source IS through the tail node Nt. The respective drains of the differential pair transistors Mip, Min are coupled to the common wiring of positive electrode side CSP and the common wiring of negative electrode side CSN.

The output wiring of positive electrode side OUTP transmits the differential output signals of positive electrode side OUTp, and the output wiring of negative electrode side OUTN transmits the differential output signals of negative electrode side OUTn. The load block LDB has loading inductors Lp and Ln which are coupled between the power supply voltage VCC and the output wiring of negative electrode side OUTN, and the output wiring of positive electrode side OUTP, respectively. The switch block SB has a plurality of switch units SU[0] to SU[n], and outputs a differential output signal OUTp, OUTn with the common signal of positive electrode side CSp in the common wiring of positive electrode side CSP and negative electrode side common signal CSn in the common wiring of negative electrode side CSN as inputs.

Each of the plurality of switch units SU[0] to SU[n] includes a plurality of switch transistor Mp1, Mp2, Mn1, and Mn2 for selecting a forward coupling state or a cross coupling state. Switch transistors Mp1, Mp2, Mn1 and Mn2 are formed on the main surface of the semiconductor substrate (not shown). That is, the gates of switch transistors Mp1, Mp2, Mn1, and Mn2 are formed on the main surface of the semiconductor substrate through the gate insulating film (not shown). The diffusing layer (not shown) constituting the source and drain of each of switch transistors Mp1, Mp2, Mn1, and Mn2 is formed in the semiconductor substrate. In the specification, a plurality of switch units SU[0] to SU[n] are collectively referred to as switch units SU.

A forward coupling state is a state in which switch transistors Mp1 and Mn1 are turned on (switch transistors Mp2 and Mn2 are turned off) to couple the common wiring of positive electrode side CSP and the common wiring of negative electrode side CSN to the output wiring of positive electrode side OUTP and the output wiring of negative electrode side OUTN, respectively. On the other hand, a cross coupling state is a state in which switch transistors Mp2 and Mn2 are turned on (switch transistors Mp1 and Mn1 are turned off) to couple the common wiring of positive electrode side CSP and the common wiring of negative electrode side CSN to the output wiring of negative electrode side OUTN and of positive electrode side OUTP, respectively.

Here, switch block SB variably sets a parallel number (quantity of switch units SU) of switch transistor used in the forward coupling state or in the cross coupling state based on a gain setting signal Wt[0], Wb[0], Wt[1], Wb[1], . . . Accordingly, the variable gain amplifier VGA amplifies the differential input signals INp, INn by a gain corresponding to the parallel number of the switch transistor in the switch block SB. The gain setting signal Wt[0], Wt[1], . . . are for forward coupling, and gain setting signal Wb[0], Wb[1], . . . are for cross coupling. The gain setting signal Wt[k] (K=0, 1, . . . ) for the forward coupling and the gain setting signal Wb[k] for the crossing coupling are complementary signals.

The magnitudes of the vectors of the axes (I axis and Q axis) shown in FIG. 1B are controlled by variably setting the parallel number of the switch transistor in the switch block SB based on the gain setting signals Wt[0], Wb[0], Wt[1], Wb[1], . . . For example, in the variable gain amplifier VGAi of FIG. 1A, a positive-side gain is controlled according to which of the gain setting signals Wt[0], Wt[1], . . . for the forward coupling is controlled to an on level ('H' level) (which of the gain setting signal Wb[0], Wb[1], . . . for the crossing coupling is controlled to an off level ('L' level)). The magnitude of the 0° vector on I axis is controlled according to the positive gain.

In the variable gain amplifier VGAi, a negative gain is controlled according to which of the gain setting signals Wb[0], Wb[1], . . . for the crossing coupling is controlled to the on level ('H' level) (which of the gain setting signals Wt[0], Wt[1], . . . for the forward coupling is controlled to the off level ('L' level)). The magnitude of the 180° vector on I axis is controlled according to the negative gain. The same applies to the variable gain amplifier VGAq in FIG. 1A.

Here, in the case of FIG. 2, gain setting signal Wt[k] (Wb[k]) (k=0, 1, . . . ) is coupled to $2^k$ of switch units SU. For example, the gain setting signal Wt[0] (Wb[0]) is coupled to 1 (=$2^0$) switch unit SU[0], and gain setting Wt[1] (Wb[1]) is coupled to 2 (=$2^1$) switch units SU[1], SU[2]. Thus, the plurality of switch units SU are divided into $2^k$ pieces (k=0, 1, . . . ) of control units, and the parallel number of the switch transistor in the switch block SB is set by combining the control units. For example, by controlling both gain setting signals Wt[0] and Wt[1] to the on level, the parallel number of switch transistors at the time of forward coupling state increases by three.

Layout Configuration of the Switch Unit

Figure 3A:
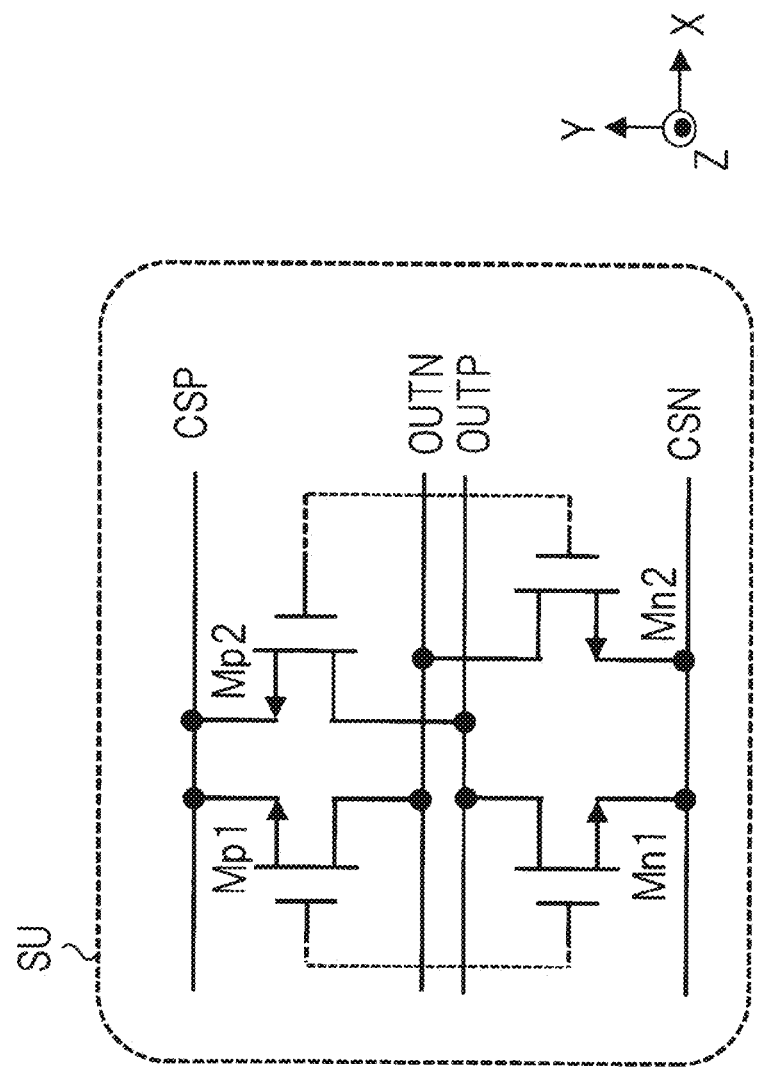
FIG. 3A is a schematic diagram showing an exemplary layout configuration in each switch unit in FIG. 2.
Figure 3B:
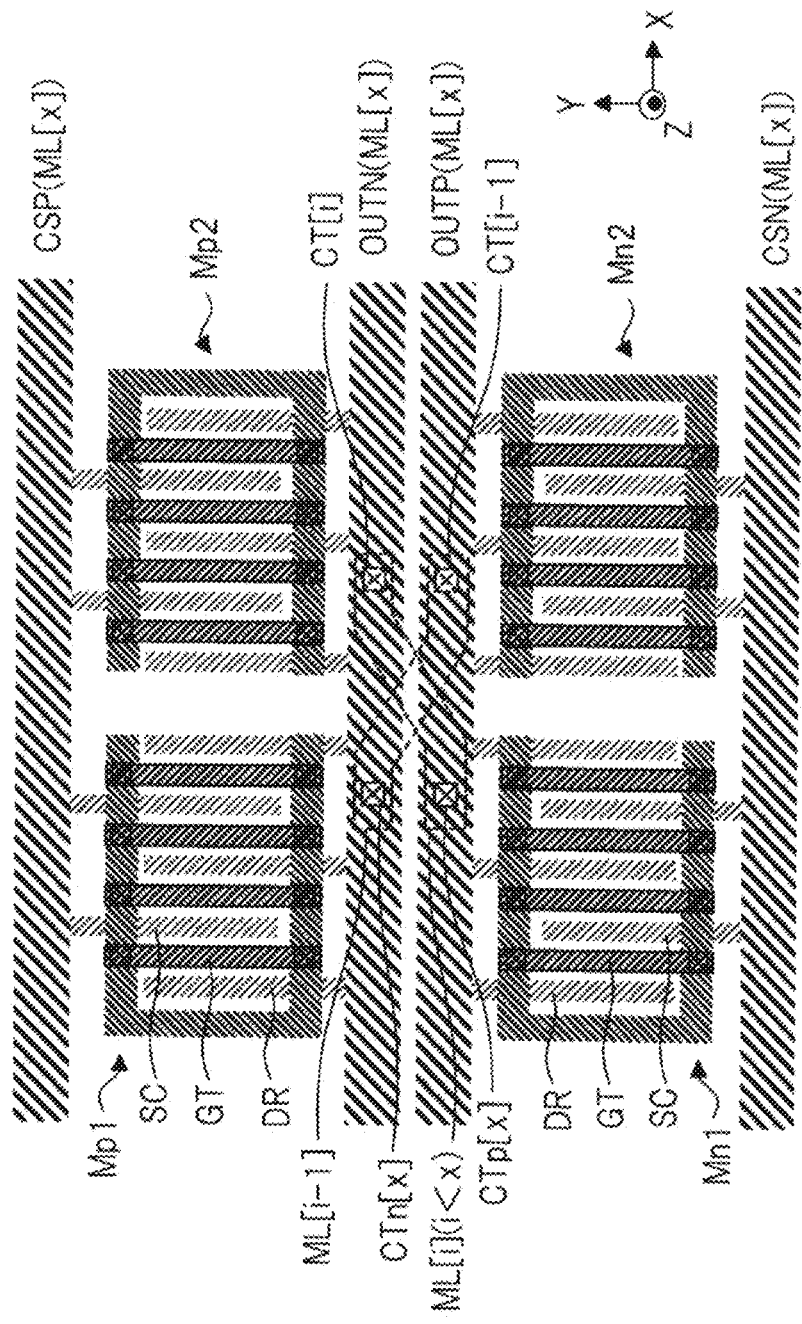
FIG. 3B is a plan view showing an exemplary actual layout configuration of FIG. 3A.

FIG. 3A is a schematic diagram showing an exemplary layout configuration in each switch unit in FIG. 2, and FIG. 3B is a plan view showing an exemplary actual layout configuration in FIG. 3A. As shown in FIGS. 3A and 3B, the common wiring of positive electrode side CSP, the common wiring of negative electrode side CSN, the output wiring of positive electrode side OUTP, and the output wiring of negative electrode side OUTN, are arranged side by side in the Y direction in a predetermined wiring layer ML[x], which is one of a plurality of wiring layer electrically isolated from each other by the interlayer insulating film, and extend in a X direction intersecting the Y direction. The wiring layer ML[x] is, for example, the wiring layer near an uppermost layer (the top of the Z axis intersecting the X direction and the Y direction).

The common wiring of positive electrode side CSP and the output wiring of negative electrode side OUTN are arranged adjacent to each other in the wiring layer ML[x], and switch transistors Mp1 and Mp2 are formed in a lower portion (lower part in the Z axis direction) between the common wiring of positive electrode side CSP and the output wiring of negative electrode side OUTN. Similarly, the common wiring CSN of negative electrode side and the output wiring of positive electrode side OUTP are arranged adjacent to each other, and switch transistors Mn1 and Mn2 are formed in a lower layer between the common wiring CSN of negative electrode side and the output wiring of positive electrode side OUTP. The output wiring of positive electrode side OUTP and the output wiring of negative electrode side OUTN are adjacently arranged in the wiring layer ML[x].

Each of the switch transistors Mp1, Mp2, Mn1, and Mn2 is an n-channel MOS transistor. Each of the switch transistors Mp1, Mp2, Mn1, and Mn2 includes a plurality of gate layers GT extending in the Y direction side by side, and a source region and a drain region formed on both sides of the gate layers GT.

The source regions of the switch transistors Mp1 and the Mp2 are connected to the common wiring of positive electrode side CSP through wirings in the respective wiring layers including a source wiring SC and a contact between the wiring layers. The drain region of the switch transistor Mp1 is connected to the output wiring of the negative electrode side OUTN through wirings in the respective wiring layers including a drain wiring DR and a contact between the wiring layers. The contact between the wiring layers includes a contact CTn[x] for connecting the drain wiring DR to the output wiring of the negative electrode side OUTN formed in the wiring layer ML[x].

On the other hand, the drain region of the switch transistor Mp2 is connected to the output wiring of positive electrode side OUTP through wirings in the respective wiring layers including a drain wiring DR and a contact between the wiring layers. The wirings in the respective wiring layers and the contact between wiring layers include contacts CT[i], CTp[x], wiring formed in a wiring layer ML[i] lower than the wiring layer ML[x], and the like. The contact CT[i] connects the drain wiring DR to a wiring of the wiring layer ML[i] (not to the wiring layer ML[x]), and the contact CTp[x] connects a wiring of the wiring layer ML[i] to the output wiring of positive electrode side OUTP formed in the wiring layer ML[x].

Similarly, the source regions of the switch transistors Mn1 and the Mn2 are connected to the common wiring of negative electrode side CSN through wirings in the respective wiring layers including a source wiring SC and a contact between the wiring layers. The drain region of the switch transistor Mn1 is connected to the output wiring of positive electrode side OUTP through wirings in the respective wiring layers including a drain wiring DR and a contact between wiring layers. A contact CTp[x] is included in the contact between the wiring layers. The contact CTp[x], as described above, in addition to connecting the drain wiring DR of the switch transistor Mp2 to the output wiring OUTP through the wiring of the wiring layer ML[i], the drain wiring DR of the switch transistor Mn1 is also connected to the output wiring OUTP.

On the other hand, the drain region of the switch transistor Mn2 is connected to the output wiring of negative electrode side OUTN through wirings in the respective wiring layers including a drain wiring DR and a contact between the wiring layers. The wirings in respective wiring layers and a contact between wiring layers include a contact CT[i-1], CTn[x], a wiring formed in a wiring layer ML[i-1] lower than the wiring layer ML[i], and the like. The contact CT[i-1] connects the drain wiring DR to the wiring of wiring layer ML[i-1] (not to wiring layer ML[x]). The contact CTn[x], in addition to connecting the drain wiring DR of the switch transistor Mp1 to the output wiring OUTN as described above, the drain wiring DR of the switch transistor Mn2 is also connected to the output wiring OUTN through the wiring of the wiring layer ML[i-1].

Figure 4A:
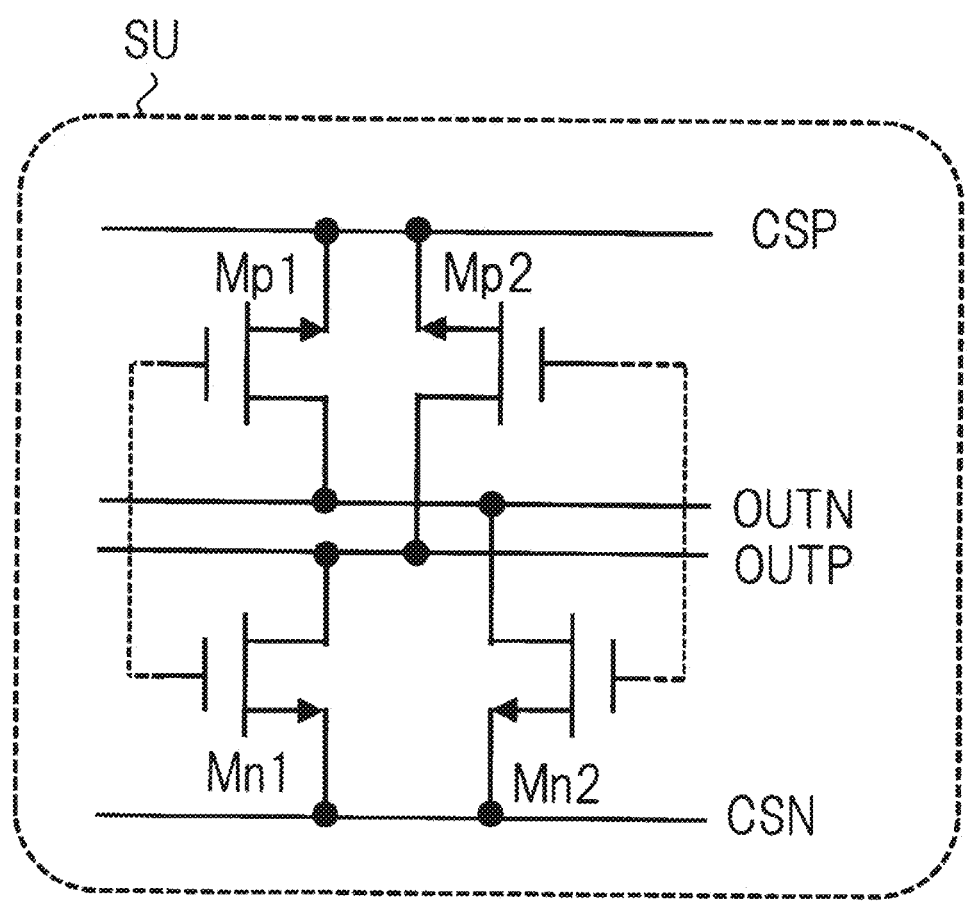
FIG. 4A is a schematic diagram of the same switch unit as the switch unit of FIG. 3A.
Figure 4B:
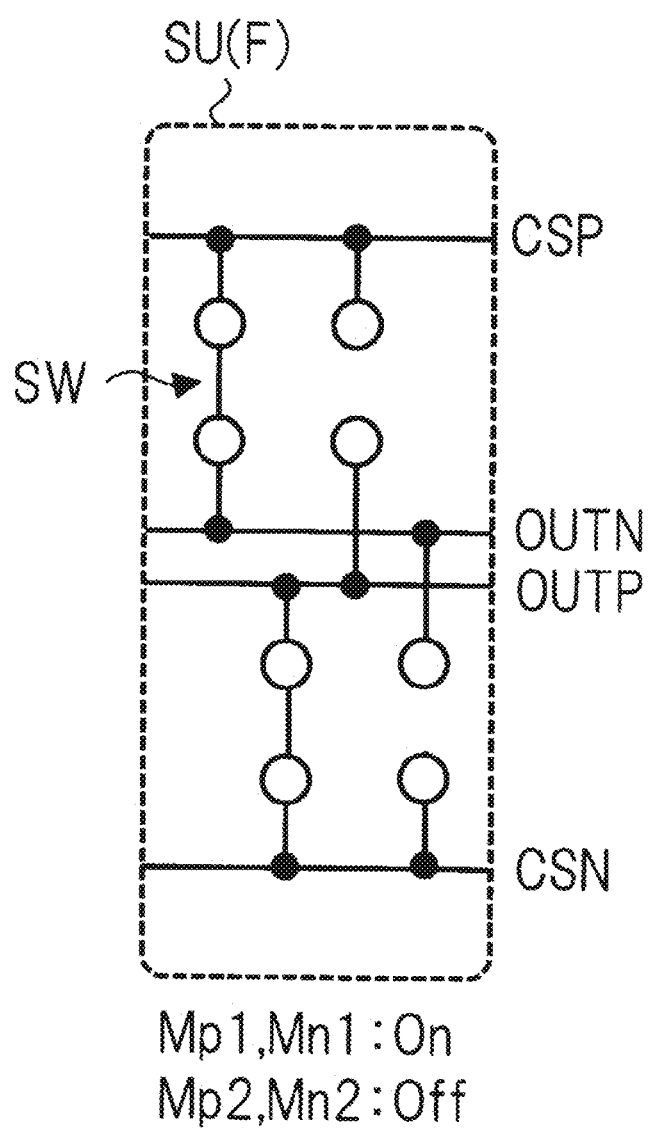
FIG. 4B is a schematic diagram schematically showing a case where the switch unit of FIG. 4A is in a forward coupling state.
Figure 4C:
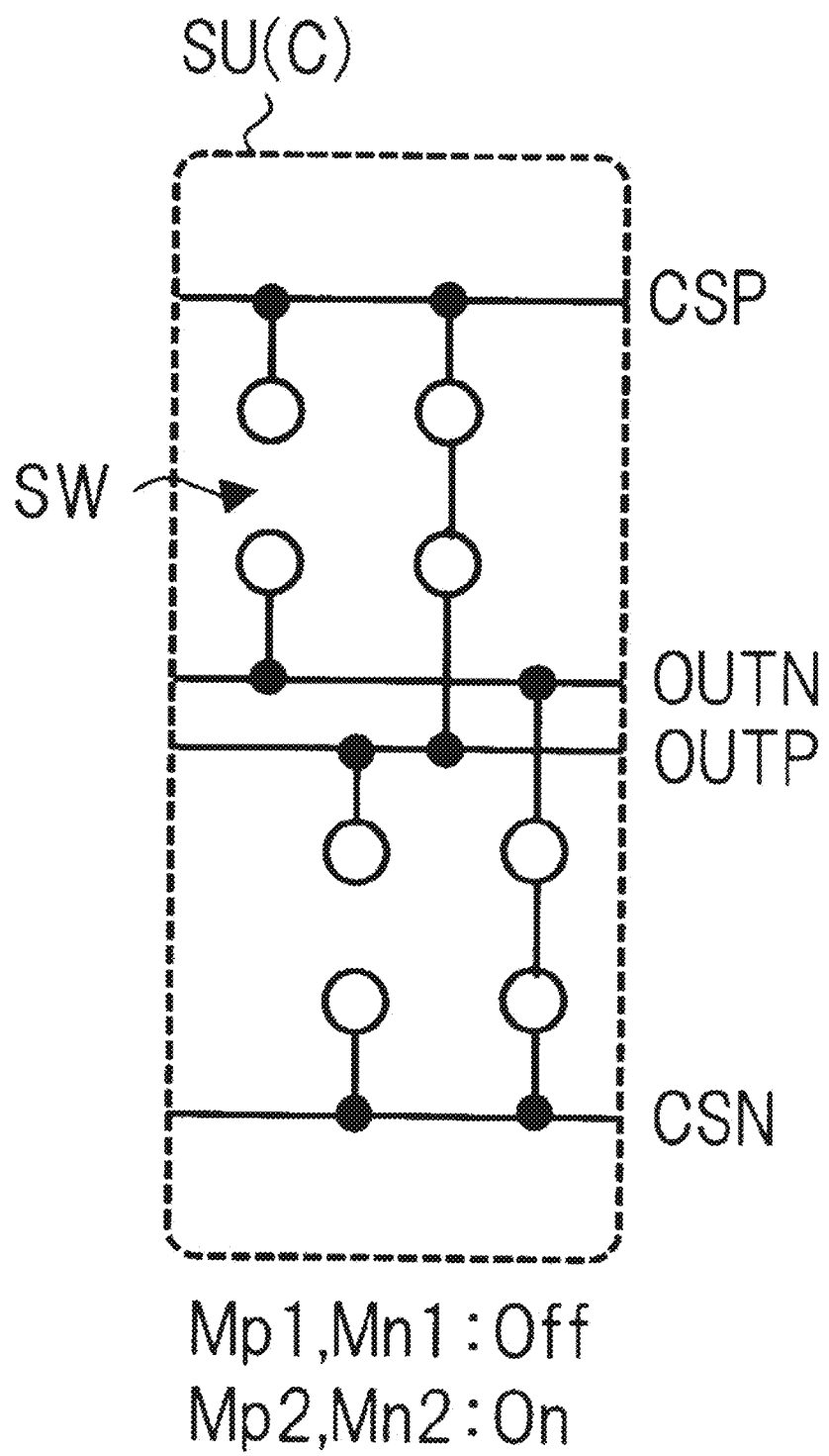
FIG. 4C is a schematic diagram schematically showing a case where the switch unit of FIG. 4A is in a cross coupling state.

FIG. 4A is a schematic diagram of the same switch unit as FIG. 3A, FIG. 4B is a schematic diagram schematically showing a case where the switch unit of FIG. 4A is in the forward coupling state, and FIG. 4C is a schematic diagram schematically showing a case where the switch unit of FIG. 4A is in a cross coupling state. In FIGS. 4B and 4C, switch transistors Mp1, Mp2, Mn1, and Mn2 in FIG. 4A are simply replaced with switches SW.

The switch unit SU shown in FIG. 4B is turned forward coupling state by turning on the switch SW corresponding to switch transistors Mp1 and Mn1 for the forward coupling. In the forward coupling state, as described above, the common wiring of positive electrode side CSP is coupled to the output wiring of negative electrode side OUTN, and the common wiring of negative electrode side CSN is coupled to the output wiring of positive electrode side OUTP. In the present specification, the switch unit SU of forward coupling state in this manner is referred to as a forward state switch unit SU(F).

On the other hand, the switch unit SU shown in FIG. 4C is in a cross coupling state by turning on the switches SW corresponding to the switch transistors Mp2 and Mn2 for the crossing coupling. In the cross coupling state, as described above, the common wiring of positive electrode side CSP is coupled to the output wiring of positive electrode side OUTP, and the common wiring of negative electrode side CSN is coupled to the output wiring of negative electrode side OUTN. In the present specification, the switch unit SU of cross coupling state is thus referred to as a crossing condition switch unit SU(C).

Layout Configuration and Problem of the Switch Block (Comparative Example)

Figure 14:
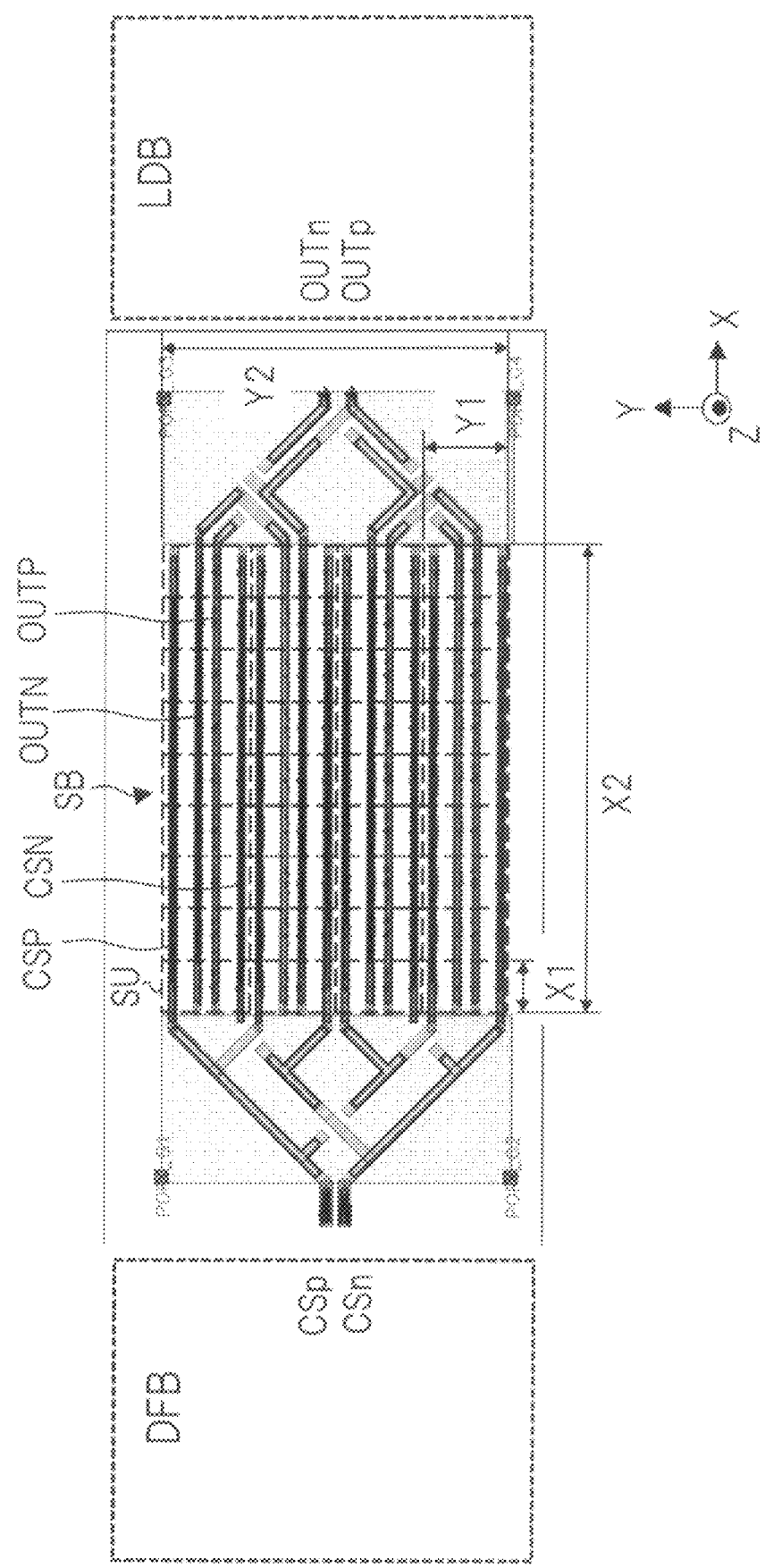
FIG. 14 is a plan view showing an exemplary layout configuration of the variable gain amplifier in FIG. 2 of a comparative semiconductor device.

FIG. 14 is a plan view showing an exemplary layout configuration of the variable gain amplifier of FIG. 2 in a semiconductor device of a comparative example. In FIG. 14, in the X direction, a differential input block DFB and a load block LDB are arranged in the both sides of the switch block SB, respectively. The switch block SB receives common signals CSp and CSn from the differential input block DFB, and outputs a differential output signal OUTp, OUTn to the load block LDB.

In switch block SB, a plurality of switch units SU are arranged in matrix in the X direction and the Y direction, in this case nine switch units SU in the X direction and four switch units SU in the Y direction. For example, the size X1 and the size Y1 of one switch unit SU are about 7 μm and about 10 μm, respectively. Accordingly, the sizes X2 and Y2 of the switch block SB are about 63 μm and about 40 μm, respectively.

In order to increase the setting resolution of gain in the variable gain amplifier VGA of FIG. 2 (and thus the setting resolution of phase θ in the phase shifter PHSF of FIGS. 1A and 1B), a large number of switch unit SU needs to be provided in the switch block SB. In addition, the shape of the switch block SB may be a generally rectangular shape from the viewpoint of layout-efficiency and the like. As a result, the X direction size X2 of the switch block SB becomes larger, and the wiring length of the common wirings CSP, CSN and the output wirings OUTP, OUTN become longer.

Figure 15A:
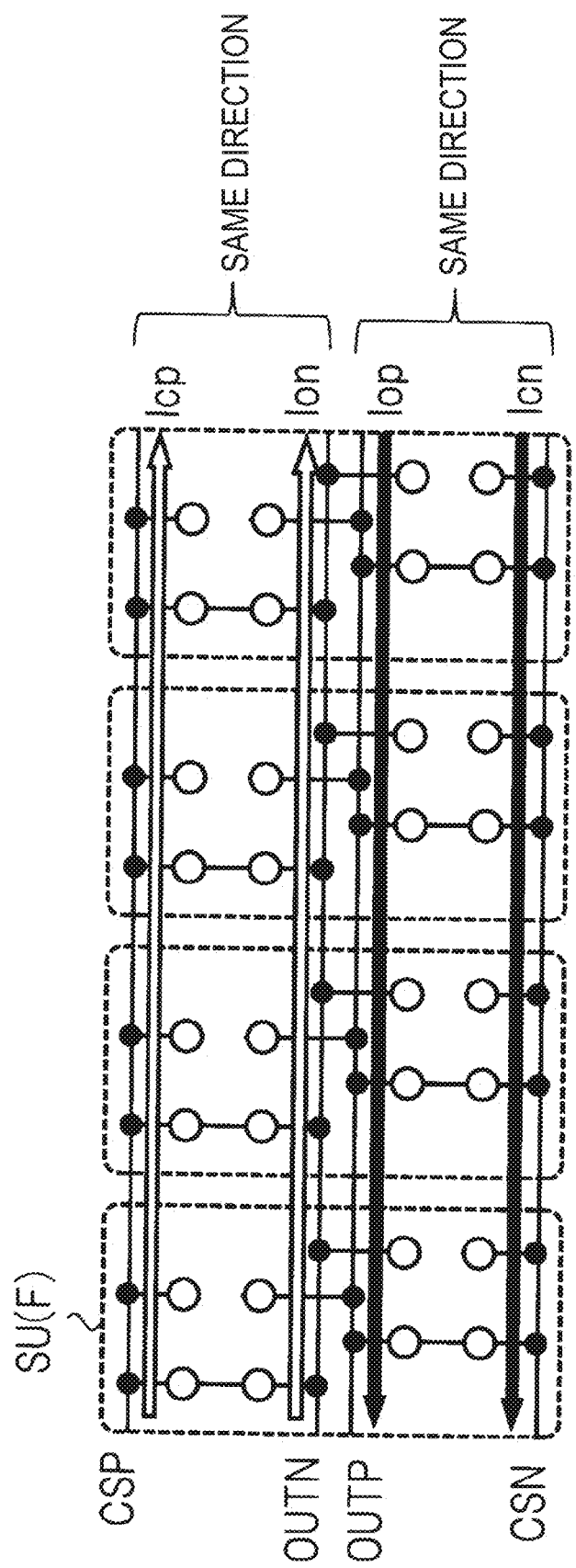
FIG. 15A and FIG. 15B are schematic diagram showing an exemplary configuration and an exemplary operation in FIG. 14 when each of the switch units is in a forward coupling state and in a cross coupling state.
Figure 15B:
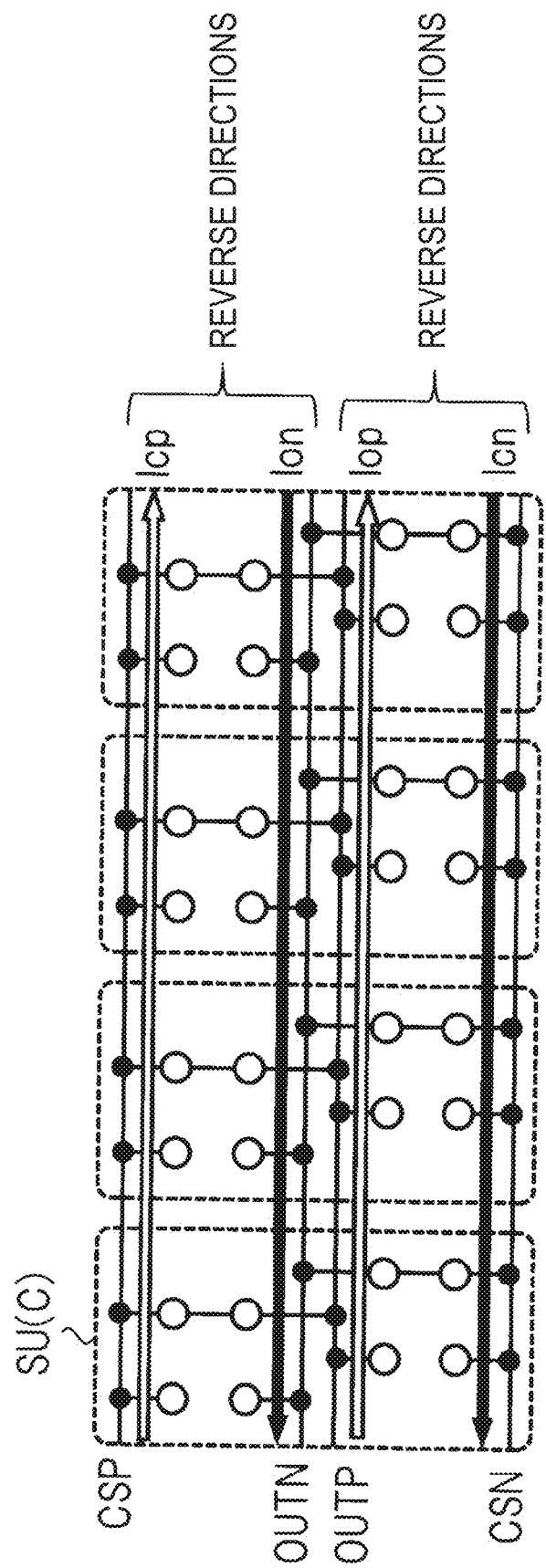
Figure 15C:
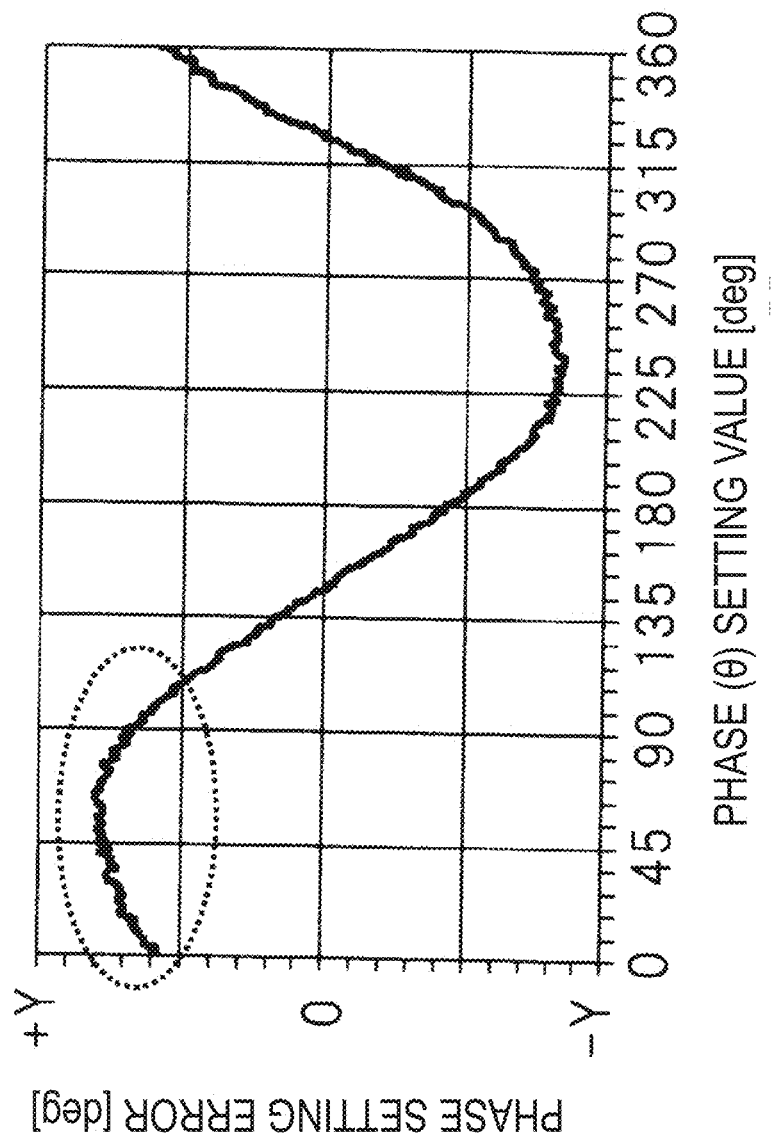
FIG. 15C is a diagram showing an exemplary simulation result for a phase shifter including the configurations of FIG. 15A and FIG. 15B.

FIG. 15A and FIG. 15B are schematic diagram showing an exemplary configuration and an exemplary operation when the respective switch unit are forward coupling state and cross coupling state in FIG. 14, and FIG. 15C is a diagram showing an exemplary simulation result to the phase shifter including the configurations of FIG. 15A and FIG. 15B.

FIG. 15A shows a plurality of forward state switch units SU(F) arranged along the direction in which the common wirings CSP, CSN and output wirings OUTP, OUTN are extended. In the forward coupling state, as can be seen from FIG. 2, the current Icp flowing in the common wiring of positive electrode side CSP and the current Ion flowing in the output wiring of negative electrode side OUTN are in the same direction, and the current Icn flowing in the common wiring of negative electrode side CSN and the current Iop flowing in the output wiring of positive electrode side OUTP are in the same direction. The currents Icp and Icn are in the reverse directions, and the currents Ion and Iop are in the reverse directions.

On the other hand, FIG. 15B shows a plurality of crossing state switch unit SU(C) arranged along the extension directions of common wirings CSP, CSN and output wirings OUTP, OUTN. In cross coupling state, the current Icp and the current Ion are in the reverse directions (the current Icp and the current Iop are in the same direction), and the current Icn and the current Iop are in the reverse directions (the current Icn and the current Ion are in the same direction). As a result of simulating the phase shifter PHSF of FIG. 1A on the assumption that such a switch block SB is used, it has been found that the setting error of phase θ increases with the gain setting error of variable gain amplifier VGA, as shown in FIG. 15C.

Factors of Gain Setting Error (Phase Setting Error)

Figure 5B:
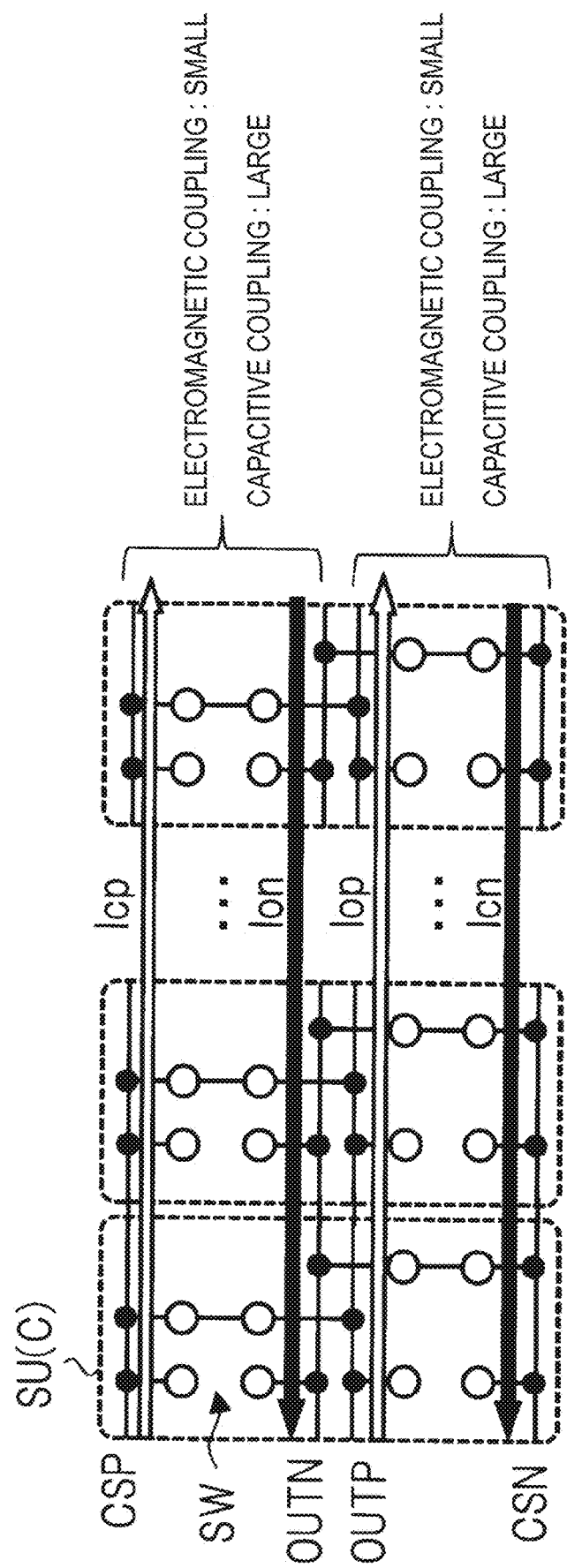
FIG. 5B is a diagram showing a main cause of a crosstalk noise that occurs at the time of cross coupling state in FIG. 15B.

FIG. 5A is a diagram showing the main cause of crosstalk noise that occurs at the time of forward coupling state in FIG. 15A, and FIG. 5B is a diagram showing the main cause of crosstalk noise that occurs at the time of cross coupling state in FIG. 15B. First, as shown in FIG. 15C, phase setting error (gain setting error) increases in a predetermined range of phase θ. On the other hand, reverse currents Iop and Ion flow through the output wiring of negative electrode side OUTN and the output wiring of positive electrode side OUTP at all times regardless of the setting values of the phase θ. Thus, phase setting error (gain setting error) is thought to be due to the crosstalk noise between output wirings OUTP, OUTN and common wirings CSP, CSN rather than between output wirings OUTP, OUTP.

A crosstalk noise caused by electromagnetic coupling (mutual inductance) increases when current flows in the same direction in adjacent wirings, for example, as in common wiring CSP and output wiring OUTN of FIG. 5A, and decreases when currents flow in reverse directions in adjacent wirings, as in common wiring CSP and output wiring OUTN of FIG. 5B. One of the factors is that electromagnetic coupling acts in a direction of differential connection when the currents in reverse directions flow, while in a direction of cumulative connection when the currents in the same direction flow.

On the other hand, a crosstalk noise associated with capacitive coupling becomes small when currents flow in the same direction in adjacent wirings as in common wiring CSP and output wiring OUTN of FIG. 5A, for example, and becomes large when currents flow in the reverse directions in adjacent wirings as in common wiring CSP and output wiring OUTN of FIG. 5B. One of the factors is that a potential difference does not easily occur between neighboring wirings when currents flow in the same direction, and a potential difference easily occurs when currents flow in the reverse directions between neighboring wirings.

Here, in FIG. 15C, in the range of the phase θ in which the phase setting error increases (for example, in the range of 0° to 90°), the number of forward state switch units SU(F) as shown in FIG. 5A is large. Thus, the main cause of phase setting error (gain setting error) is considered to be the crosstalk noise associated with the electromagnetic coupling (mutual inductance) between adjacent common wiring CSP and output wiring OUTN (and between adjacent common wiring CSN and output wiring OUTP). It is also believed that the crosstalk noise associated with such electromagnetic coupling is of a non-negligible magnitude, particularly when millimeter wave signal and quasi-millimeter wave signal are used.

Layout Configuration of a Switch Block (First Embodiment)

Figure 6A:
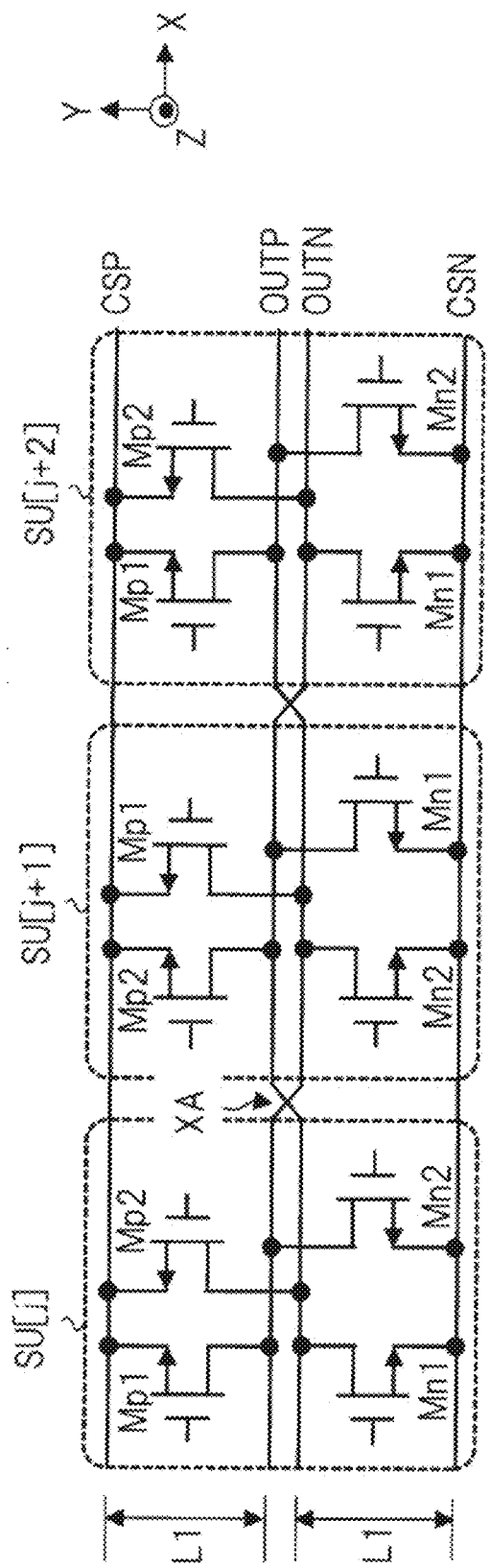
FIG. 6A is a schematic diagram showing an exemplary layout configuration in the switch block of FIG. 2 of the semiconductor device according to the first embodiment.
Figure 6B:
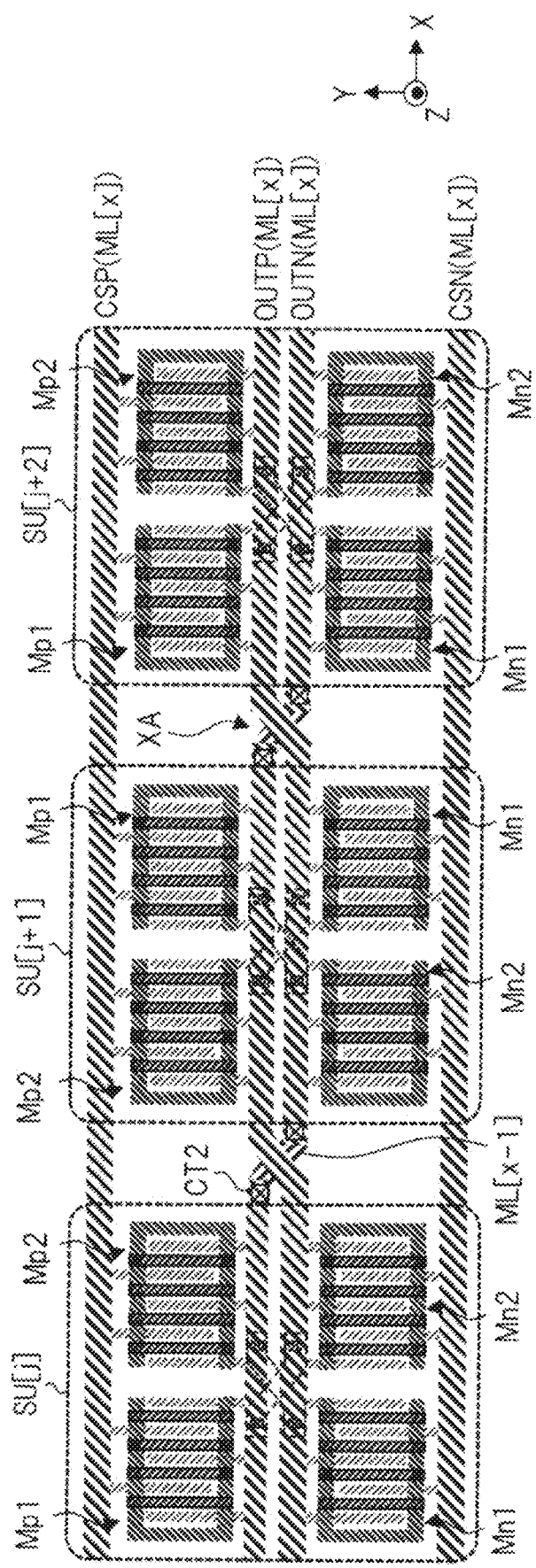
FIG. 6B is a plan view showing an exemplary actual layout configuration of FIG. 6A.

FIG. 6A is a schematic diagram showing an exemplary layout configuration in the switch block of FIG. 2 in the semiconductor device according to the first embodiment, and FIG. 6B is a plan view showing an exemplary actual layout configuration of FIG. 6A. In this example, three switch units SU[j], SU[j+1], and SU[j+2] arranged in order towards the X direction are shown. The common wiring of positive electrode side CSP, the common wiring of negative electrode side CSN, the output wiring of positive electrode side OUTP, and the output wiring of negative electrode side OUTN are arranged side by side in the Y direction in a predetermined wiring layer ML[x] and extend in the X direction similarly to those shown in FIGS. 3A and 3B.

On the other hand, as shown in FIG. 6B, the output wiring of positive electrode side OUTP and the output wiring of negative electrode side OUTN are different from that in FIG. 14 described above, and output wiring pair (OUTN, OUTP) is configured by the output wiring of positive electrode side OUTP and the output wiring of negative electrode side OUTN which are extending in the X direction while crossing each other through a wiring layer different from the predetermined wiring layer ML[x](e.g., wiring layer ML[x-1] of one lower layer). That is, the output wiring of positive electrode side OUTP and the output wiring of negative electrode side OUTN cross each other in the plan view while being electrically isolated from each other by the interlayer insulating film. For this reason, as shown in FIG. 6B, the output wiring pair (OUTN, OUTP) includes a crossing part XA including crossing wires in the wiring layer ML[x-1] and the contact CT2 connecting the wiring layer ML[x-1] and the wiring layer ML[x]. A crossing part XA is provided between neighboring switch units SU, in this example every switch unit SU.

The common wiring of positive electrode side CSP and the common wiring of negative electrode side CSN are placed in the both sides of the output wiring pair (OUTN, OUTP) in the Y direction in the wiring layer ML[x]. However, although the detail is shown in FIG. 10B to be described later, with respect to common wirings CSP, CSN, both of them need not necessarily be arranged next to the output wiring pair (OUTN, OUTP), and at least one of them may be arranged next to the output wiring pair (OUTN, OUTP).

The layouts in the respective switch units SU are the same as those in FIGS. 3A and 3B. However, with the provision of the crossing part XA, replacement of the switch transistor or the like is performed as appropriate. In this example, in the switch unit SU[j+1], switch transistor Mp1 and switch transistor Mp2 are swapped and switch transistor Mn1 and switch transistor Mn2 are swapped with reference to the switch unit SU[j].

Figure 7A:
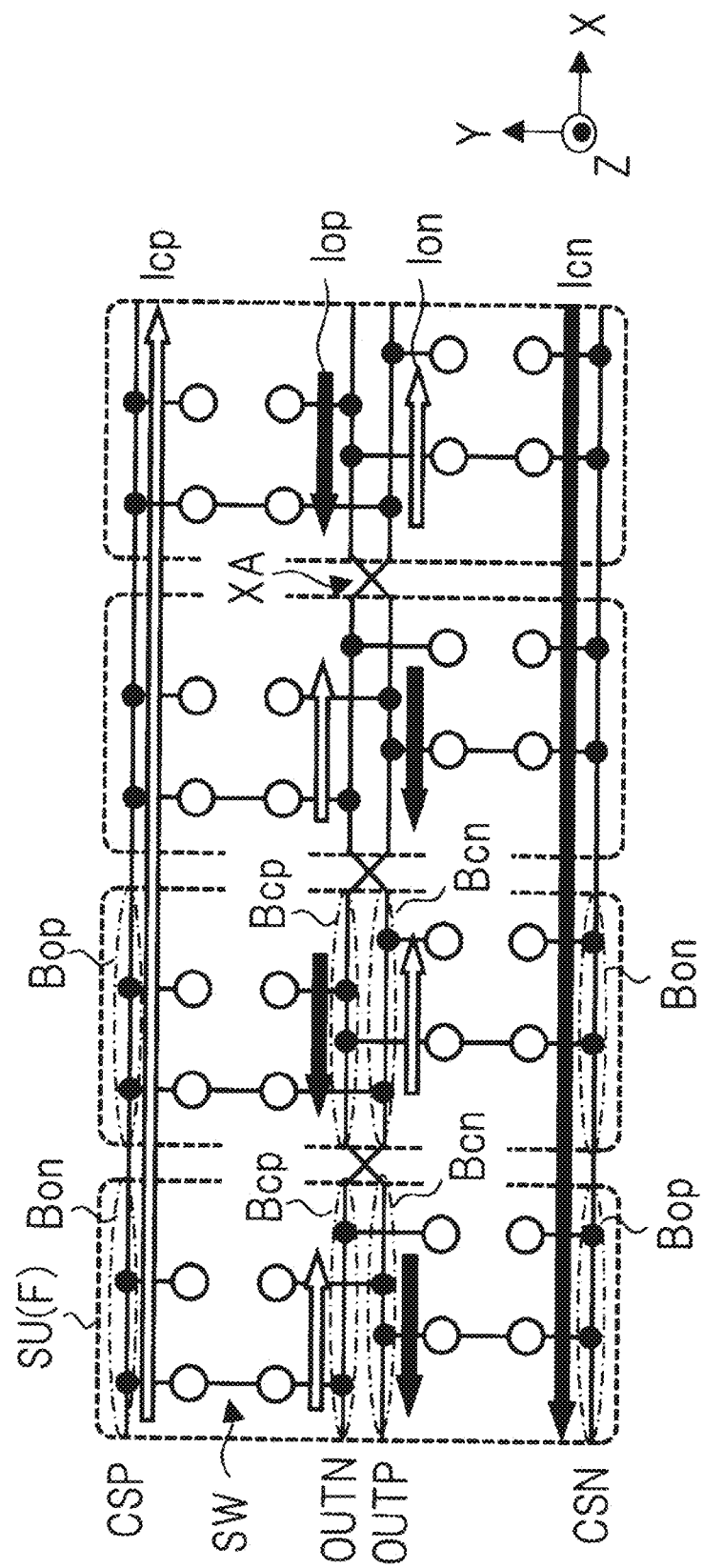
FIG. 7A and FIG. 7B are schematic diagrams showing an exemplary configuration and exemplary operation for each switch unit in a forward coupling state and in a cross coupling state in FIG. 6A and FIG. 6B.
Figure 7B:
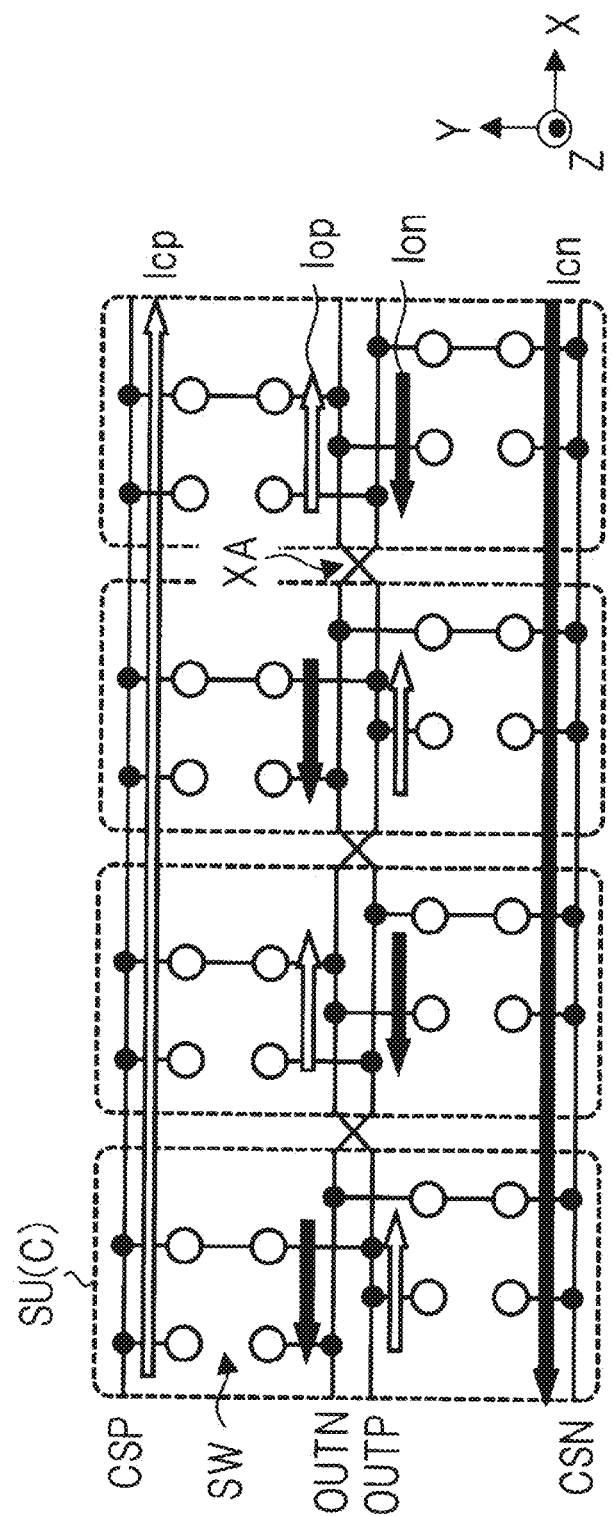
Figure 7C:
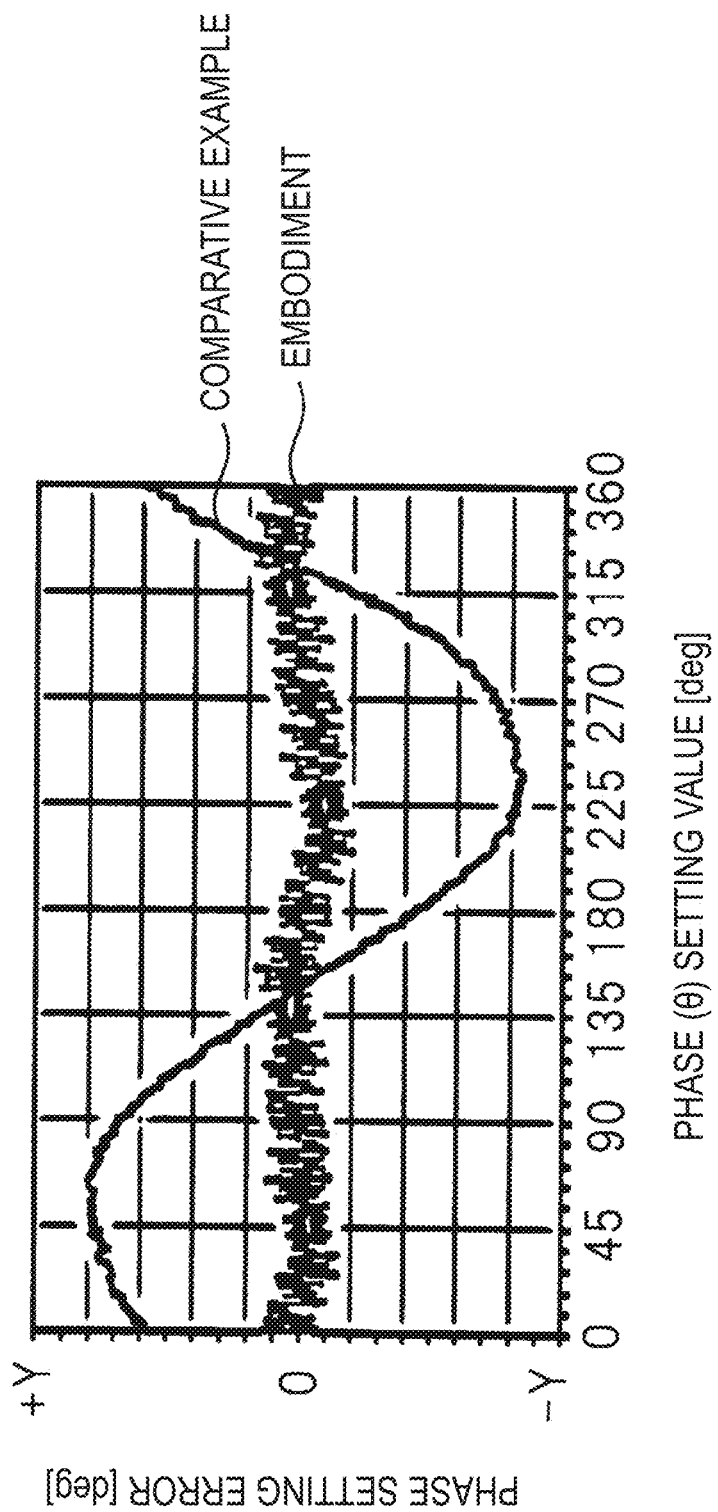
FIG. 7C is a diagram showing an example of a simulation result for phase shifter including the configurations of FIG. 7A and FIG. 7B.

FIG. 7A and FIG. 7B are schematic diagram showing exemplary configuration and exemplary operation when the switch unit is forward coupling state and cross coupling state in FIG. 6A and FIG. 6B, and FIG. 7C is a diagram showing an exemplary simulation result to the phase shifter including the configuration of FIG. 7A and FIG. 7B. FIG. 7A shows a plurality of forward state switch unit SU(F) arranged in order toward the X direction, and FIG. 7B shows a plurality of crossing states switch unit SU(C) arranged in order toward the X direction. Each output wiring OUTN, OUTP has a section Bcp, Bcn according to the crossing part XA is installed, for example, as shown in FIG. 7A.

A section Bcp is a section which is arranged next to the common wiring of positive electrode side CSP at a distance L1 (see FIG. 6A) and is not arranged next to the common wiring of negative electrode side CPN. Conversely, the section Bcn is a section that is placed next to the common wiring of negative electrode side CSN at a spacing L1 and not next to the common wiring of positive electrode side CSP. The length of section Bcp and the length of section Bcn are equivalent. Also, in each of the output wiring OUTN, OUTP, the section Bcp and the section Bcn are alternately arranged toward the X direction.

As a result, in the relationship between the common wiring CSP and the output wiring OUTN and the relationship between the common wiring CSN and the output wiring OUTP, the section in which currents flow in the same direction is halved as compared with the cases of FIGS. 15A and 15B. As a result, crosstalk noise associated with electromagnetic coupling (mutual inductance) can be reduced in output wirings OUTN, OUTP. Furthermore, here, since each output wiring OUTN, OUTP has the section Bcp and the section Bcn, the crosstalk noise associated with electromagnetic coupling can be further reduced.

More specifically, crosstalk noise (P) is generated in the section Bcp by the electromagnetic coupling accompanied by the current Icp of +X direction in the common wiring CSP. On the other hand, crosstalk noise (N) is generated in the section Bcn by the electromagnetic coupling associated with the current Icn of −X direction (equal to the reverse current of the current Icp) in the common wiring CSN. Since the crosstalk noise (P) and the crosstalk noise (N) are equal in magnitude and opposite in polarities, they are cancelled out. As a result, in output wiring OUTN, OUTP, the crosstalk noise associated with electromagnetic coupling can be further reduced, ideally nulled.

Similarly, each of the common wiring CSP,CSN has sections Bon, Bop according to the installation of the crossing part XA. A section Bon is a section that is placed next to the output wiring of negative electrode side OUTN with a spacing L1 and not next to the output wiring of positive electrode side OUTP. A section Bop is a section that is placed next to the output wiring of positive electrode side OUTP at a spacing L1 and not next to the output wiring of negative electrode side OUTN. The length of the section Bon and the length of the section Bop are equivalent. Also, in each of the common wiring CSP, CSN, the section Bon and the section Bop are alternately arranged toward the X direction.

As a result, in the relationship between common wiring CSP and output wiring OUTN and the relationship between common wiring CSN and output wiring OUTP, the section in which currents flow in the same direction is halved as compared with the cases of FIGS. 15A and 15B. As a result, crosstalk noise associated with electromagnetic coupling (mutual inductance) can be reduced in common wirings CSP, CSN. Furthermore, here, since each common wiring CSP, CSN has the section Bon and the section Bop, the crosstalk noise associated with electromagnetic coupling can be further reduced.

Specifically, as with the section Bcp, Bcn, the crosstalk noise (P) is generated in the section Bon by the electromagnetic coupling associated with the +X direction current Iop at the output wiring OUTN. On the other hand, in section Bop, the crosstalk noise (N) is generated by the electromagnetic coupling with the current Iop of −X direction (equal to the reverse current of the current Ion) in the output wiring OUTP. Since the crosstalk noise (P) and the crosstalk noise (N) are equal in magnitude and opposite in polarities, they are cancelled out. As a result, in common wirings CSP, CSN, the crosstalk noise associated with electromagnetic coupling can be further reduced, ideally nulled.

In the cross coupling state shown in FIG. 7B, the direction of the current Ion and the direction of the current Iop are interchanged as compared with the case of FIG. 7A. However, the effect of crosstalk noise is the same as that of FIG. 7A according to the installation of the crossing part XA. That is, in the switch block SB of the first embodiment, the effect of crosstalk noise is hardly dependent on forward coupling state or cross coupling state, unlike in FIGS. 15A and 15B.

As a result of simulating the phase shifter PHSF of FIG. 1A on the assumption that such a switch block SB is used, as shown in FIG. 7C, the setting error of the phase θ becomes sufficiently small as compared with the case of FIG. 15C (comparative example). Although the crosstalk noise associated with the magnetic coupling between common wiring CSP and output wiring OUTN (and common wiring CSN and output wiring OUTP) has been described here, the crosstalk noise associated with capacitive coupling can also be reduced by the same mechanism. That is, for example, in the cross coupling state as shown in FIG. 5B, there is a fear of the effect of crosstalk noise accompanying capacitive coupling, but the effect can also be reduced.

Layout Configuration of a Switch Block (Modified Example)

Figure 8A:
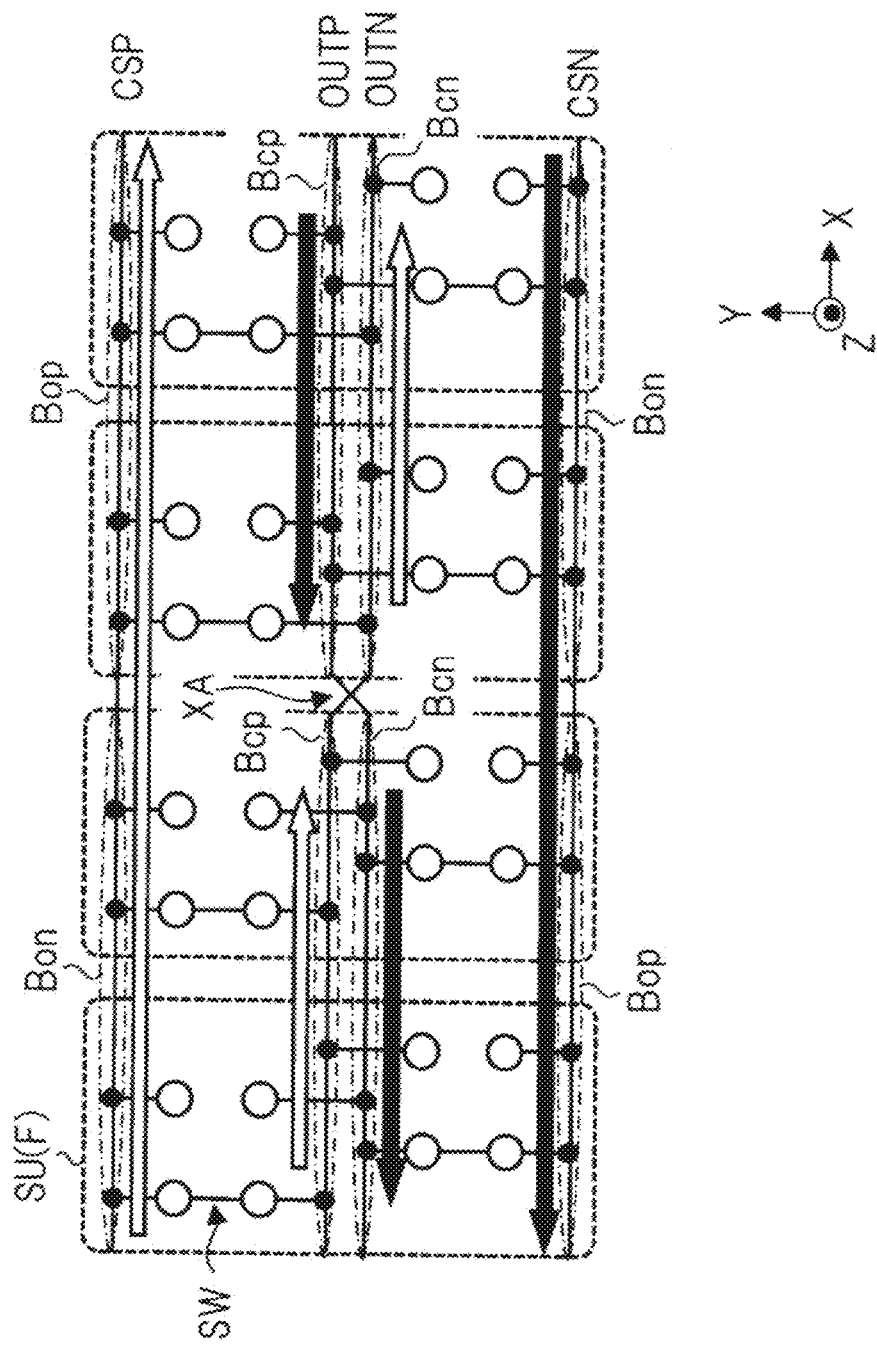
FIG. 8A and FIG. 8B are schematic diagrams showing a modified exemplary configuration and a modified exemplary operation of FIG. 7A and FIG. 7B.
Figure 8B:
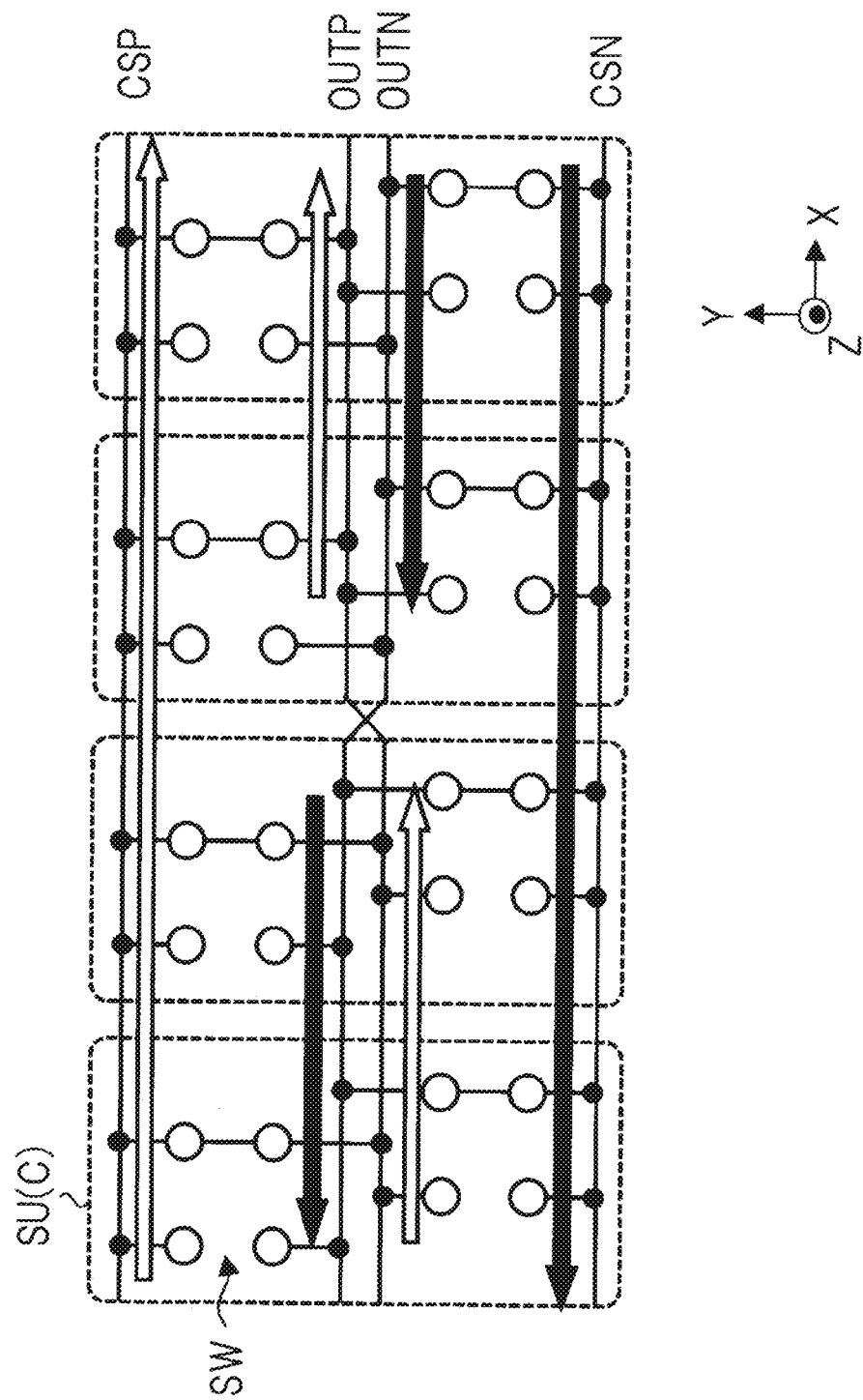

FIGS. 8A and 8B are schematic diagram showing the modified exemplary configuration and exemplary operation of FIGS. 7A and 7B. In FIG. 7A and FIG. 7B, the crossing part XA is provided for each switch unit SU, and accordingly, the section Bcp and the section Bcn of each output wiring OUTN, OUTP are replaced for each switch unit SU. On the other hand, in FIG. 8A and FIG. 8B, crossing part XA is provided for every two switch units SU, and the section Bcp and the section Bcn are replaced for every two switch units SU accordingly.

As described above, for example, by providing two sections Bcp, Bcn in the output wiring OUTN, it is possible to ideally cancel crosstalk noise even when the section is long. Therefore, as shown in FIG. 8A and FIG. 8B, a configuration in which two (or more) pieces of crossing part XA are provided for every switch unit SU may be used. However, in the cases of FIG. 8A and FIG. 8B, in reality, there is a fear that the cancellation of the crosstalk noise may be inadequate in accordance with various variation factors and the like. On the other hand, if the length of each section is shortened, the strength itself of the magnetic coupling generated in each section (the crosstalk noise size itself) can be reduced, and the effect of crosstalk noise as a whole can be further reduced. In this respect, it is more advantageous to use the configurations of FIGS. 7A and 7B than FIGS. 8A and 8B. Further, when the configurations of FIGS. 7A and 7B are used, as described with reference to FIG. 2, there is no need to consider the consistency between the crossing part XA and the control unit when the respective switch units SU are divided into $2^k$ pieces of control unit, thereby facilitating designing and the like.

Main Effect of the First Embodiment

The use of the first embodiment scheme typically enables a reduction in the setting error of gain associated with crosstalk noise in a semiconductor device with variable gain amplifier. As a result, high-precision phase control can be performed by applying the variable gain amplifier to the phase shifter. Such effects are more pronounced particularly in the semiconductor device where millimeter wave signal and quasi-millimeter wave signal are handled.

Second Embodiment

Layout Configuration of a Switch Block (Second Embodiment)

Figure 9:
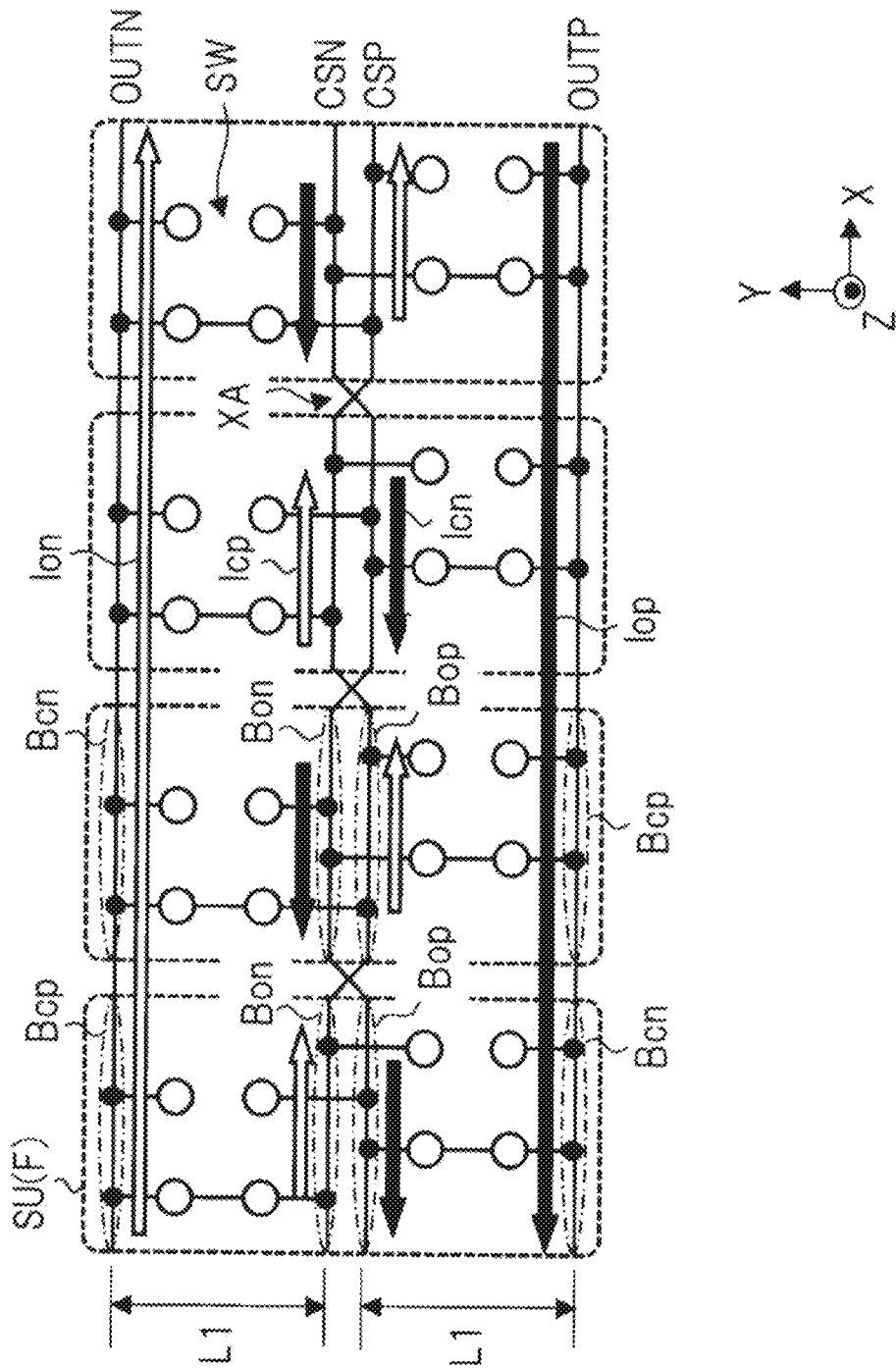
FIG. 9 is a schematic diagram showing an exemplary layout configuration and an exemplary operation in the switch block of FIG. 2 of a semiconductor device according to a second embodiment.

FIG. 9 is a schematic diagram showing the exemplary layout configuration and exemplary operation in the switch block of FIG. 2 in the semiconductor device according to the second embodiment. FIG. 9 shows a plurality of forward state switch units SU(F) arranged in order towards the X direction. The plurality of forward state switch units SU(F) has a configuration in which the arrangement of common wirings CSP, CSN and output wirings OUTN, OUTP is interchanged with respect to the exemplary configuration of FIG. 7A.

That is, similarly to the output wiring pair (OUTN, OUTP) shown in FIG. 6B, the common wiring of negative electrode side CSN and the common wiring of positive electrode side CSP are extended in the X direction while crossing each other through the wiring layer (ML[x-1]) of the lower layer, thereby forming the common wiring pair (CSP, CSN). That is, the common wiring of positive electrode side CSP and the common wiring of negative electrode side CSN cross each other in the plan view while being electrically isolated from each other by the interlayer insulating film. The associated crossing part XA is provided between neighboring switch units SU, in this instance every switch unit SU. The output wiring of negative electrode side OUTN and the output wiring of positive electrode side OUTP are arranged in the both sides of the common wiring pair (CSP, CSN) in the Y direction. However, with respect to output wirings OUTN, OUTP, both of them need not necessarily be arranged next to common wiring pair (CSP, CSN), but at least one of them may be arranged next to common wiring pair (CSP, CSN).

Each common wiring CSP, CSN has a section Bon, Bop according to the crossing part XA is installed. A section Bon is a section that is placed next to the output wiring of negative electrode side OUTN with a spacing L1 and not next to the output wiring of positive electrode side OUTP. Conversely, the section Bop is a section that is placed next to the output wiring of positive electrode side OUTP at a spacing L1 and not next to the output wiring of negative electrode side OUTN. The length of the section Bon and the length of the section Bop are equivalent. Also, in each of the common wiring CSP, CSN, the section Bon and the section Bop are alternately arranged toward the X direction.

On the other hand, each output wiring OUTN, OUTP has sections Bcp, Bcn. A section Bcp is a section that is placed next to the common wiring of positive electrode side CSP at a spacing L1 and not next to the common wiring of negative electrode side CSN. Conversely, the section Bcn is a section that is placed next to the common wiring of negative electrode side CSN at a spacing L1 and not next to the common wiring of positive electrode side CSP. The length of the section Bcp and the length of the section Bcn are equivalent. Also, in each of the output wirings OUTN, OUTP, the section Bcp and the section Bcn are alternately arranged toward the X direction.

Similar to FIG. 7A, each of the common wirings CSP, CSN has sections Bon, Bop, so that the effect of the crosstalk noise associated with the electromagnetic coupling (mutual inductance) can be cancelled out. Each output wiring OUTN, OUTP can also have sections Bcp, Bcn to cancel the effects of crosstalk noise associated with electromagnetic coupling.

<Main effect of the Second Embodiment> When the second embodiment method is used, the same effect as the first embodiment method can be obtained. Further, depending on the convenience of the layout design and the like, it is possible to select whether the output wirings OUTN, OUTP are provided with a crossing part XA as in the case of first embodiment or the common wirings CSP, CSN are provided with a crossing part XA as in the case of second embodiment, thereby improving flexibility in the layout design.

Third Embodiment

Layout Configuration of a Switch Block (Modified Example)

Figure 10A:
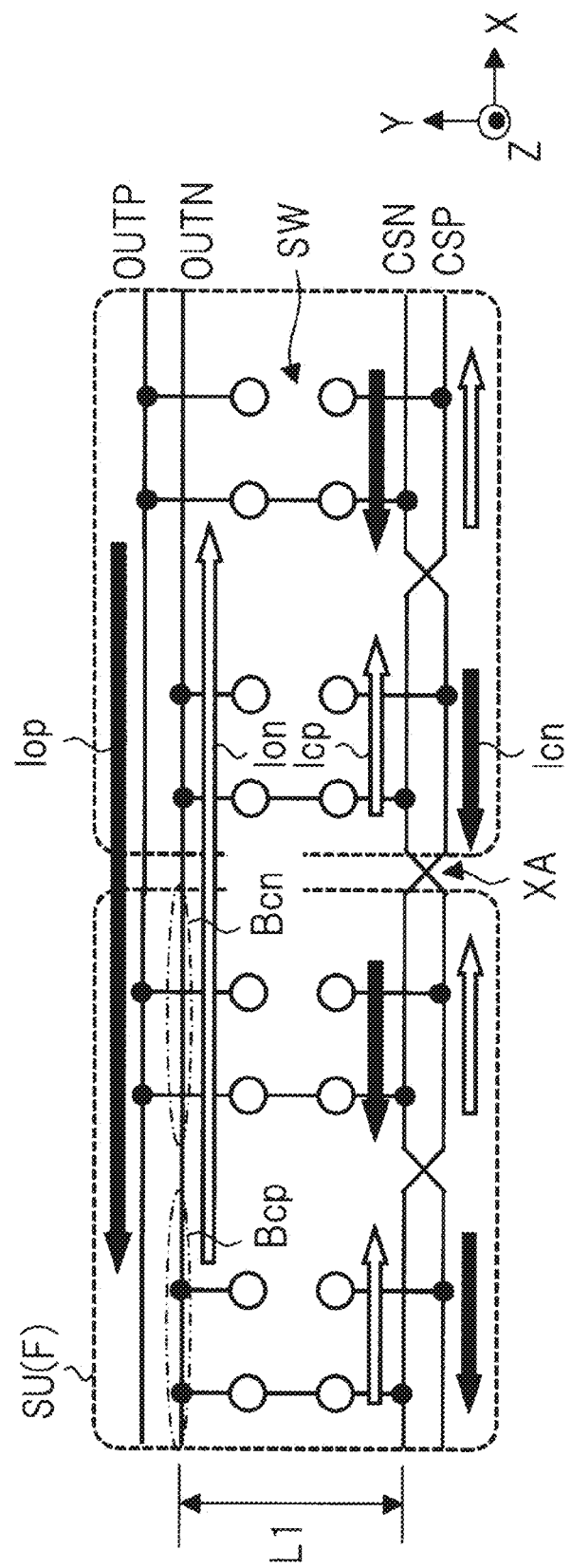
FIG. 10A, FIG. 10B, and FIG. 10C are schematic diagram showing different exemplary layout configuration and exemplary operation in the switch block of FIG. 2 of a semiconductor device according to a third embodiment.
Figure 10B:
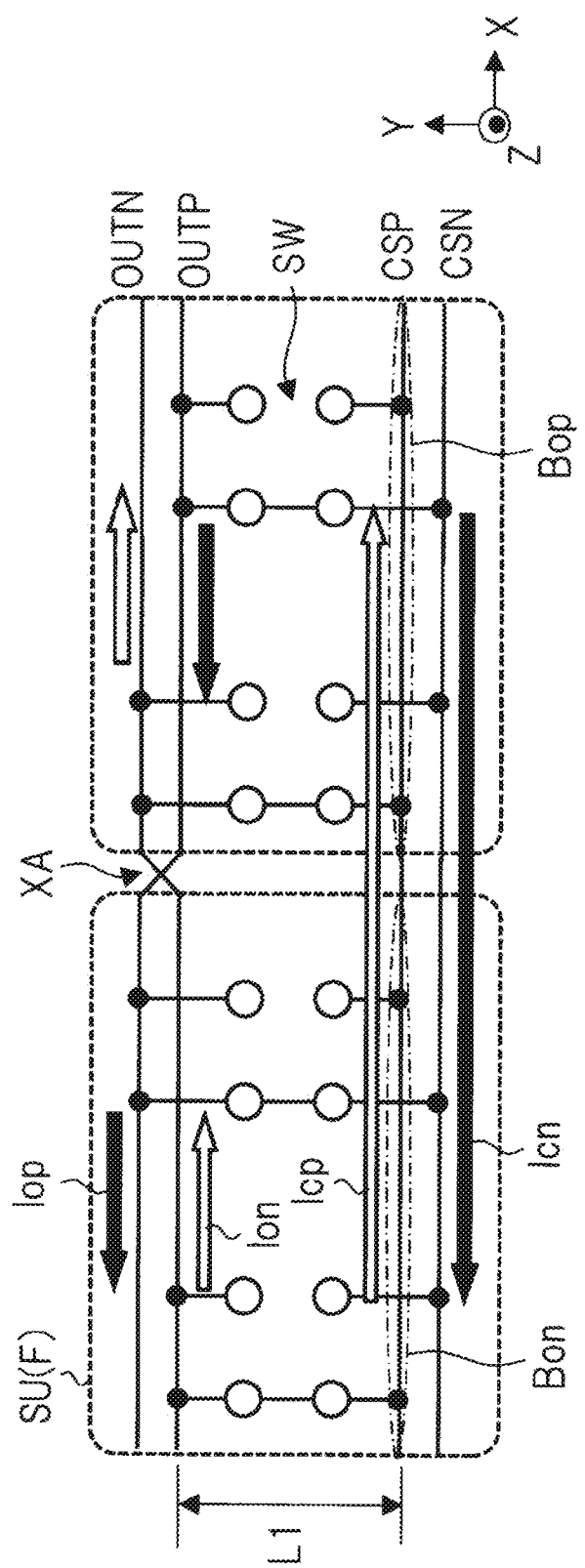
Figure 10C:
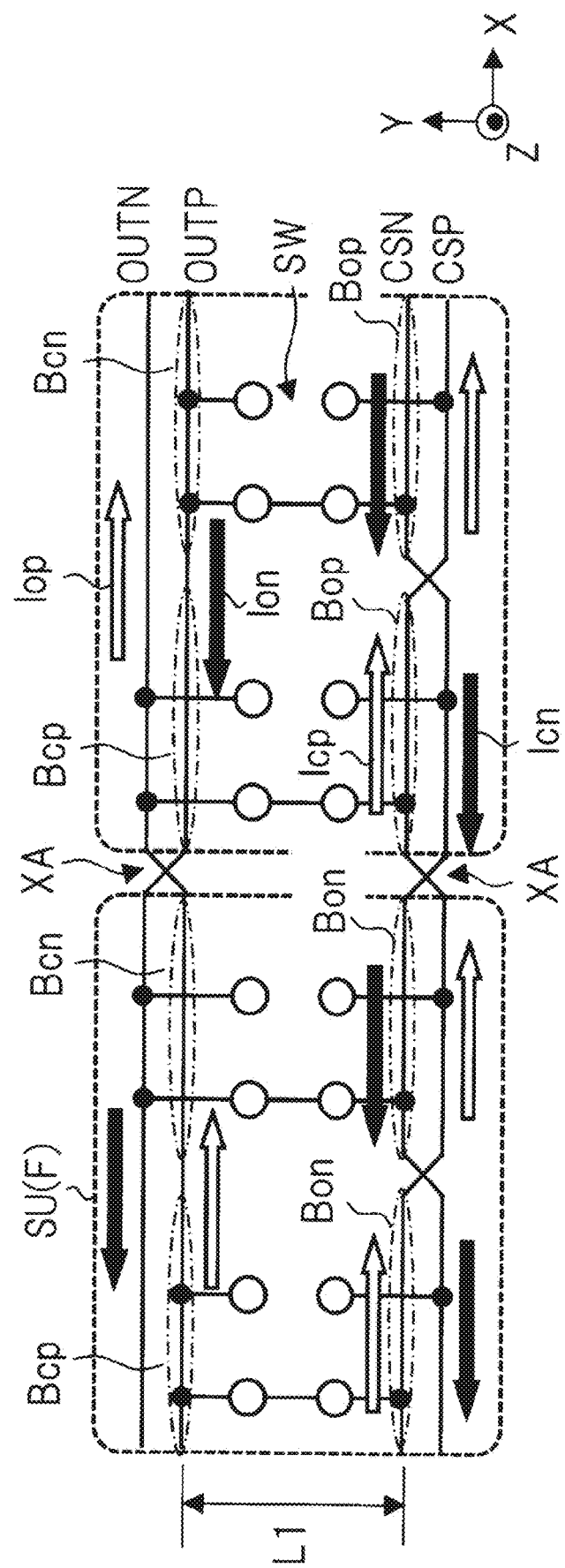

FIGS. 10A, 10B and 10C are schematic diagram showing different layout exemplary configuration and different layout exemplary operation in the switch block of FIG. 2 in the semiconductor device according to the present third embodiment. Each of the FIGS. 10A, 10B and 10C shows a plurality of forward state switch units SU(F) arranged in order toward the X direction. With respect to forward state switch unit SU(F), four switch transistors (switches SW) are arranged two by two in the Y direction in first embodiment and second embodiment, but in third embodiment they are arranged together in sequence towards the X direction.

In FIG. 10A, common wirings CSP, CSN comprise a crossing part XA to constitute common wiring pair (CSP, CSN). One of the output wiring OUTN, OUTP (here OUTN) is placed next to the common wiring pair (CSP, CSN). However, the other (OUTP) of the output wiring OUTN, OUTP is placed next to the output wiring OUTN and not next to the common wiring pair (CSP, CSN).

Here, output wiring OUTN has a section Bcp where electromagnetic coupling occurs with common wiring CSP and a section Bcn where electromagnetic coupling occurs with common wiring CSN. As a result, in the output wiring OUTN, the crosstalk noise associated with electromagnetic coupling is cancelled out. Common wirings CSP, CSN, on the other hand, both receive crosstalk noise associated with electromagnetic coupling from one (OUTN) of the output wiring OUTN, OUTP. For this reason, it may be difficult to cancel crosstalk noise when each common wiring CSP, CSN is viewed alone. However, since common wirings CSP, CSN constitute a differential pair, the effect of crosstalk noise can be reduced to some extent even in common wirings CSP, CSN by the elimination characteristics of common-mode noises accompanying the differential pair.

In FIG. 10B, output wirings OUTN, OUTP comprise a crossing part XA to constitute output wiring pair (OUTN, OUTP). One of the common wiring CSP, CSN (here CSP) is placed next to the output wiring pair (OUTN, OUTP). However, the other (CSN) of the common wiring CSP, CSN is placed next to the common wiring CSP and not next to the output wiring pair (OUTN, OUTP).

Here, common wiring CSP has a section Bon where electromagnetic coupling occurs with the output wiring OUTN and a section Bop where electromagnetic coupling occurs with the output wiring OUTP. As a result, in the common wiring CSP, the crosstalk noise associated with electromagnetic coupling is cancelled out. Output wirings OUTN, OUTP, on the other hand, both receive crosstalk noise associated with electromagnetic coupling from one (CSP) of the common wirings CSP, CSN. Similar to FIG. 10A, since output wirings OUTN, OUTP constitute a differential pair, the effect of crosstalk noise can be reduced to some extent also in output wirings OUTN, OUTP.

In FIG. 10C, common wirings CSP, CSN comprise a crossing part XA to constitute common wiring pair (CSP, CSN). The output wirings OUTN, OUTP also include a crossing part XA to constitute an output wiring pair (OUTN, OUTP). Common wiring pair (CSP, CSN) and output wiring pair (OUTN, OUTP) are arranged next to each other. Here, each of the common wirings CSP, CSN has a section Bon and a section Bop, and each of the output wirings OUTN, OUTP also has a section Bcp and a section Bcn. Therefore, crosstalk noise can be cancelled out in the respective wires.

Main Effect of the Third Embodiment

When the third embodiment system is used, the same effect as the first embodiment method can be obtained. In particular, in the configuration as shown in FIG. 10C, the setting error of gain associated with crosstalk noise can be reduced. In addition, as in second embodiment, the flexibility in designing layouts can be improved.

Fourth Embodiment

Layout Configuration around a Switch Block

Figure 11:
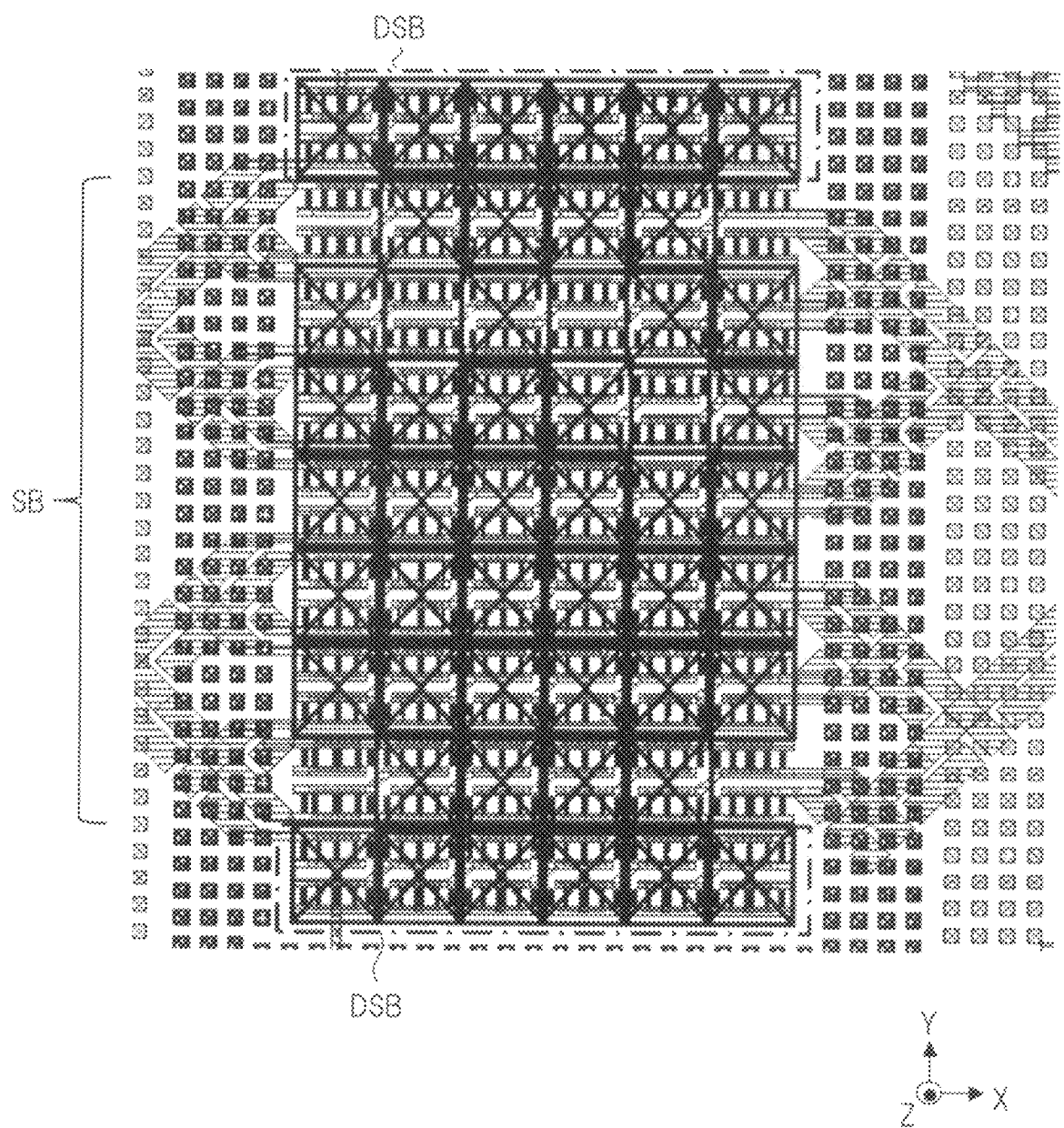
FIG. 11 is a plan view showing an exemplary layout configuration around the switch block in FIG. 2 of a semiconductor device according to a fourth embodiment.

FIG. 11 is a plan view showing the layout exemplary configuration around the switch block in FIG. 2 in the semiconductor device according to the fourth embodiment. In FIG. 11, a dummy switch block DSB is provided in addition to the switch block SB. The dummy switch block DSB is located next to the switch block SB (both sides in this instance) in the Y direction and has a layout that replicates the layout of the switch block SB. Unlike the switch block SB, a plurality of switch transistor included in the dummy switch block are always fixed off.

By using such a configuration, the layout environment of the entire switch block SB can be kept uniform, including the layout environment at both ends of the Y direction of the switch block SB. As a result, the values of the mutual inductance between the wires become uniform over the entire switch block SB, and noise components that may be caused by non-uniformities can be suppressed.

The output wirings OUTN, OUTP and common wirings CSP, CSN in the dummy switch block DSB may be insulated or conductive with respect to the output wirings OUTN, OUTP and common wirings CSP, CSN, respectively, in the switch block SB. When configured to be conductive, only the wire (one of the common wirings CSP, CSN in FIG. 6A) adjoining the switch block SB in the dummy switch block DSB may be configured to be conductive. By configuring so as to be conductive, uniformity of the entire switch block SB including the operating environments can be achieved.

Main Effect of the Fourth Embodiment

When the fourth embodiment method is used, the same effect as the first embodiment method can be obtained. Further, by providing the dummy switch block DSB, it is possible to suppress noise components due to non-uniformity of layouts, and it is possible to further reduce the setting error of the gain.

Fifth Embodiment

An Example to Apply a Gain Amplifier

Figure 12A:
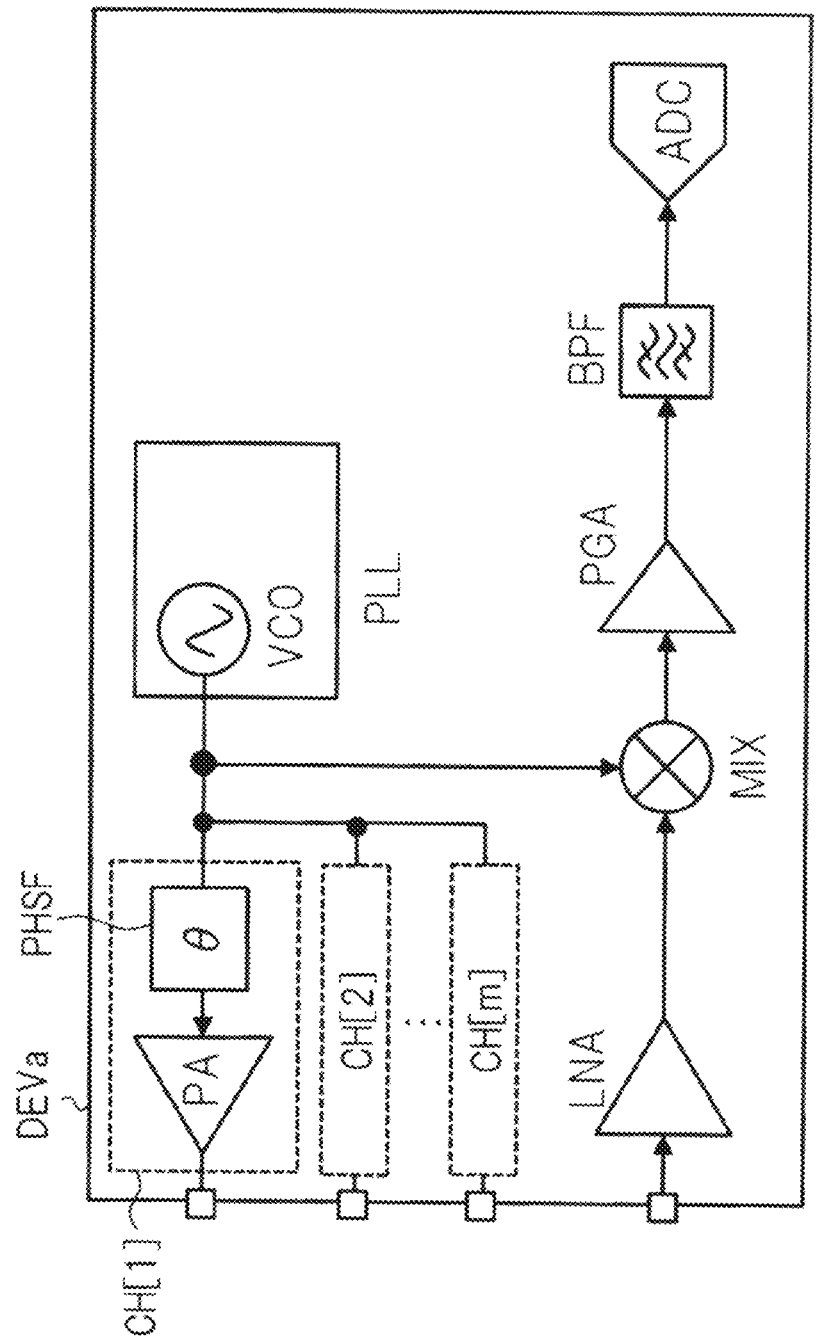
FIG. 12A is a schematic diagram showing an exemplary configuration of a semiconductor device according to a fifth embodiment.

FIG. 12A is a schematic diagram showing the exemplary configuration of the semiconductor device according to the fifth embodiment, and FIG. 12B is a schematic diagram showing the exemplary operation of FIG. 12A. The semiconductor device DEVa shown in FIG. 12A is, for example, a front-end IC included in a radar device or the like for controlling a phased array antenna or the like. The semiconductor device DEVa includes a PLL (Phase Locked Loop), a plurality of transmission channel blocks CH[1] to CH[m], a low noise amplifier LNA, a mixer MIX, a programmable gain amplifier PGA, a bandpass filter BPF, and an analog to digital converter ADC.

The PLL includes a voltage controlled oscillator VCO and generate a local signal (e.g., FMCW (Frequency Modulated Continuous Wave)) with predetermined frequency. Each of the plurality of transmission channel blocks CH[1] to CH[m] comprises a phase shifter PHSF and a power amplifier PA. The configuration shown in FIG. 1A is applied to the phase shifter PHSF. The phase shifter PHSF shifts the phase of the local signal from the PLL according to the phase setpoint (θ) (in particular gain setting signal Wi, Wq).

The power amplifier PA amplifies the signal from the phase shifter PHSF and transmits the amplified signal to the antenna ANT. As shown in FIG. 12B, by appropriately controlling the phase set values (θ) of the plurality of transmission channel blocks CH[1] to CH[m], the transmitted signals (TXs) (beams) from the antennas ANTs can have directivity.

The low noise amplifier LNA amplifies a received signal (RX) of the antenna ANT (e.g., a beam reflected by an object). The mixer MIX multiplies the signal from the low noise amplifier LNA by the local signal from the PLL. The bandpass filter BPF filters the signal from the mixer MIX, and the analog to digital converter ADC converts the analogue signal from the bandpass filter BPF to a digital signal. By performing frequency analysis or the like on the digital signal, it is possible to detect, for example, a distance to an object, a relative speed, or the like.

Figure 13:
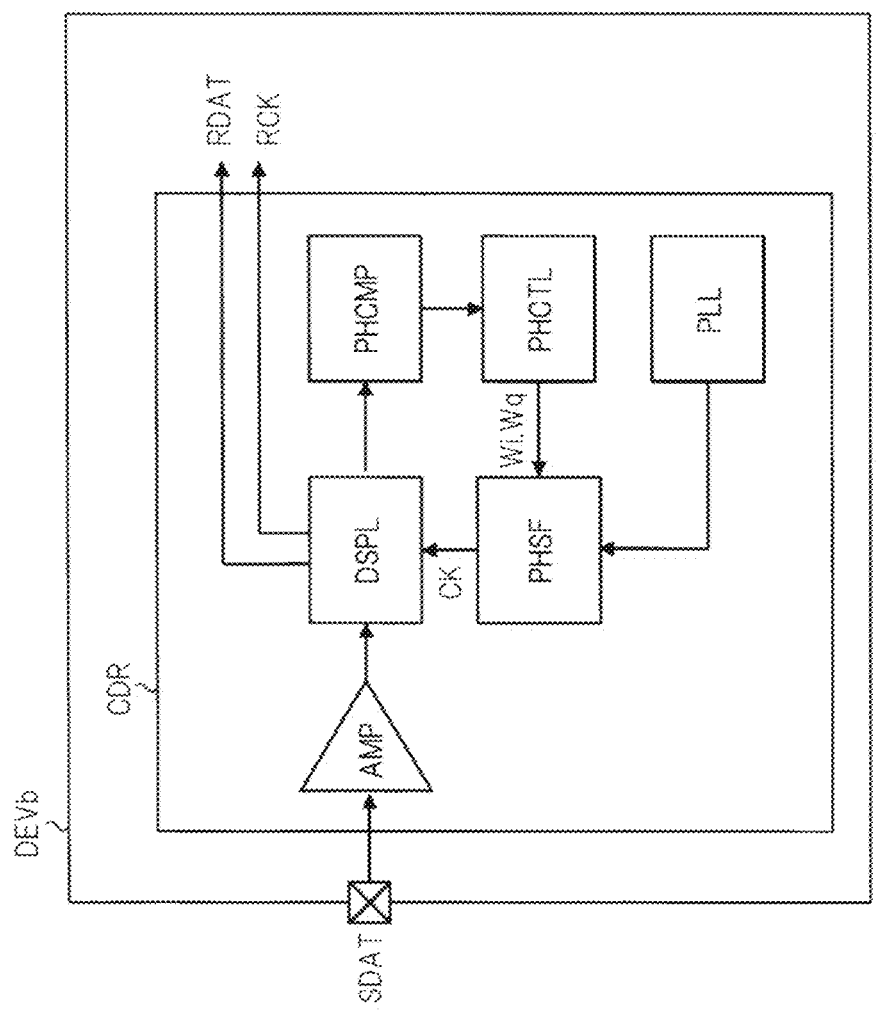
FIG. 13 is a schematic diagram showing another exemplary configuration of the semiconductor device according to the fifth embodiment.

FIG. 13 is a schematic diagram illustrating another exemplary configuration of a semiconductor device according to the fifth embodiment. The semiconductor device DEVb shown in FIG. 13 includes a clock data reproducing circuit CDR that receives a high-speed serial data SDAT such as 10 Gbps and generates regenerated clock signal RCK and reproduction data RDAT. The clock data reproducing circuit CDR includes an amplifier AMP, a data sampling circuit DSPL, a phase comparator PHCMP, a phase control circuit PHCTL, a PLL, and a phase shifter PHSF. The configuration shown in FIG. 1A is applied to the phase shifter PHSF.

The amplifier AMP amplifies an external serial data SDAT. The data sampling circuit DSPL samples an output signal from the amplifier AMP based on a clock signal CK from the phase shifter PHSF. The phase comparator PHCMP compares the phase of the output signal from the amplifier AMP with the phase of the clock signal CK from the phase shifter PHSF. The phase control circuit PHCTL generates a phase setting signal (gain setting signal Wi, Wq) so that both phases have a predetermined relationship based on the compared result of the phase comparator PHCMP, and instructs the phase shifter PHSF of the signal. The phase shifter PHSF shifts the phase of the reference clock signal from the PLL based on the phase setting signal (gain setting signals Wi, Wq) to generate the clock signal CK directed to the data sampling circuit DSPL. By appropriately adjusting the phase of the clock signal CK, the data sampling circuit DSPL can generate the correct regenerated clock signal RCK and reproduction data RDAT.

Main Effect of Fifth Embodiment

For example, when the semiconductor device DEVa of FIG. 12A is used, the accuracy of the phase shifter PHSF can be improved by the methods of first to fourth embodiments, so that the directivity of the beam transmitted from the antenna ANT can be enhanced even when the transmission channel block is small. The reduction in transmission channel block contributes to a reduction in power consumption, a reduction in chip area, and the like. In addition, when the semiconductor device DEVb of FIG. 13 is used, the accuracy of the clock signal CK from the phase shifter PHSF can be increased. As a result, for example, in the data sampling circuit DSPL, the error rate of the reproduction data RDAT can be reduced, and the reliability can be improved.

Although the invention made by the present inventor has been specifically described based on the embodiment, the present invention is not limited to the embodiment described above, and various modifications can be made without departing from the gist thereof.

Additional Statement

A semiconductor device comprising:
a differential pair transistor coupled between a tail node, a first common wiring, and a second common wiring and receiving differential input signals,
a first output wiring and a second output wiring for transmitting a differential output signal,
a switch block that can variably set a parallel number of the switch transistors used for coupling, and including a plurality of switch units each including a plurality of switch transistors for selecting a forward coupling state in which the first output wiring and the second output wiring are coupled to the first output wiring and the second output wiring respectively or a cross coupling state in which the first common wiring and the second common wiring are coupled to the second output wiring and the first output wiring respectively,
wherein the first common wiring, the second common wiring, the first output wiring, and the second output wiring are arranged side by side in a first direction in a predetermined wiring layer, which is one of a plurality of wiring layers, and extend in a second direction crossing the first direction,
wherein at least one of the first output wiring and the second output wiring has a first section arranged adjacent to the first output wiring at a first interval in the first direction and is not arranged adjacent to the second output wiring and a second section arranged adjacent to the second output wiring at the first interval in the first direction and is not arranged next to the first output wiring.

What is claimed is:
1. A semiconductor device comprising:
a semiconductor substrate having a main surface;
a plurality of wiring layers formed on the main surface;
a first common wiring and a second common wiring arranged side by side in a first direction in a plan view in the plurality of wiring layers and extended in a second direction crossing the first direction in the plan view;
a first differential input wiring and a second differential input wiring arranged side by side in the first direction in the plan view in the plurality of wiring layers, extended in the second direction in the plan view, and transmitting differential input signals;
a first differential transistor formed on the main surface such that a drain of which is coupled to the first common wiring and a gate of which is coupled to the first differential input wiring;
a second differential transistor formed on the main surface such that a drain of which is coupled to the second common wiring and a gate of which is coupled to the second differential input wiring;
an output wiring pair transmitting differential output signals and comprised of a first output wiring and a second output wiring arranged in the plurality of wiring layers; and
a switch block variably set a parallel number of the switch transistors used for coupling, and including a first switch unit and a second switch unit arranged next to each other in the second direction in the plan view, each including a plurality of switch transistors for selecting a forward coupling state in which the first output wiring and the second output wiring are coupled to the first output wiring and the second output wiring, respectively, or a cross coupling state in which the first common wiring and the second common wiring are coupled to the second output wiring and the first output wiring, respectively,
wherein the first output wiring and the second output wiring cross each other in a first crossing part between the first switch unit and the second switch unit in the second direction in the plan view.

2. The semiconductor device according to claim 1, further comprising a third switch unit including a plurality of switch transistors for selecting a forward coupling state in which the first output wiring and the second output wiring are coupled to the first output wiring and the second output wiring respectively or a cross coupling state in which the first common wiring and the second common wiring are coupled to the second output wiring and the first output wiring respectively,
wherein the third switch unit is arranged next to the second switching unit in the second direction in the plan view, and
wherein the first output wiring and the second output wiring cross each other in a second crossing part between the second switch unit and the third switch unit in the second direction in the plan view.

3. The semiconductor device according to claim 1,
wherein the first common wiring and the second common wiring are arranged on both sides of the pair of output wirings in the first direction, respectively,
wherein the first common wiring, the second common wiring, the first output wiring, and the second output wiring are arranged in a first wiring layer included in the plurality of the wiring layers and arranged above the main surface through a first interlayer insulating film,
wherein the first output wiring and the second output wiring cross each other through the first interlayer insulating film,
wherein the first common wiring and the second common wiring extended in the second direction forms a common wiring pair by extending in the second direction and intersecting with each other through a second wiring layer included in the plurality of the wiring layers and insulated from the first wiring layer through a second interlayer insulating film, and
wherein the common wiring pair is arranged next to the output wiring pair in the first direction.

4. The semiconductor device according to claim 1,
wherein each of the first and second switch units includes:
a first switch transistor and a second switch transistor that are turned on in the forward coupling state; and
a third switch transistor and a fourth switch transistor that are turned on in the cross coupling state,
wherein the pair of output wirings has an intersection portion in which wirings between neighboring switch units are intersected.

5. The semiconductor device according to claim 4,
wherein the switch block includes a plurality of switch units including the first and second switch units,
wherein the plurality of switch units are divided into $2^k$ (k=0, 1, ...) control units,
wherein the number of the switch transistors in the switch blocks is set by combining the control units, and
wherein the crossing part is provided for each of the regions between switch units.

6. The semiconductor device according to claim 4, further comprising a dummy switch block arranged next to the switch block in the first direction, wherein the dummy switch block has a layout replicating the layout of the switch block,
wherein the plurality of switch transistors included in the dummy switch block are fixed to be off-state.

7. The semiconductor device according to claim 1, wherein the differential input signals are quasi-millimeter wave signals or millimeter wave signals.

8. The semiconductor device according to claim 1, further comprising:
a first variable gain amplifier including the first differential transistor, the second differential transistor, and the switch block, and amplifying the differential input signals having a predetermined phase with a gain corresponding to the parallel number of switches in the switch block;
a second variable gain amplifier including the first differential transistor, the second differential transistor, and the switch block, and amplifying the differential input signals having a phase different from the predetermined phase by 90 degrees with a gain corresponding to the parallel number of switches in the switch block; and
a synthesizer combining the differential output signals from the first variable gain amplifier and the differential output signals from the second variable gain amplifier.

9. A semiconductor device comprising:
a semiconductor substrate having a main surface;
a plurality of wiring layers formed on the main surface;
a common wiring pair comprised of a first common wiring and a second common wiring arranged in the plurality of wiring layers, extended in a second direction crossing the first direction in the plan view;
a first differential input wiring and a second differential input wiring arranged side by side in the plurality of wiring layers and extended in the second direction crossing the first direction in the plan view, and transmitting differential input signals;
a first differential transistor formed on the main surface and having a drain coupled to the first common wiring and a gate coupled to the first differential input wiring;
a second differential transistor formed on the main surface and having a drain coupled to the second common wiring and having a gate coupled to the second differential input wiring;
a first output wiring and a second output wiring which are arranged in the plurality of wiring layers and transmitting differential output signals; and
a switch block variably set a parallel number of the switch transistors used for coupling, and including a first switch unit and a second switch unit arranged next to each other in the second direction in the plan view, each including a plurality of switch transistors for selecting a forward coupling state in which the first output wiring and the second output wiring are coupled to the first output wiring and the second output wiring respectively, or a cross coupling state in which the first common wiring and the second common wiring are coupled to the second output wiring and the first output wiring respectively,
wherein the first output wiring and the second output wiring cross each other in a first crossing part between the first switch unit and the second switch unit in the second direction in the plan view.

10. The semiconductor device according to claim 9, further comprising a third switch unit including a plurality of switch transistors for selecting a forward coupling state in which the first output wiring and the second output wiring are coupled to the first output wiring and the second output wiring respectively or a cross coupling state in which the first common wiring and the second common wiring are coupled to the second output wiring and the first output wiring respectively,
wherein the third switch unit is arranged next to the second switching unit in the second direction in the plan view, and
wherein the first output wiring and the second output wiring cross each other in a second crossing part between the second switch unit and the third switch unit in the second direction in the plan view.

11. The semiconductor device according to claim 9,
wherein the first output wiring and the second output wiring are arranged on both sides of the pair of common wirings in the first direction, respectively,
wherein each of the first and second switch units comprises:
a first switch transistor and a second switch transistor which are turned on in the forward coupling state; and
a third switch transistor and a fourth switch transistor which are turned on in the cross coupling state,
wherein the common wiring pair has a crossing part which intersects with each other between neighboring switch units.

12. The semiconductor device according to claim 11, further comprising a dummy switch block arranged next to the switch block in the first direction,
- wherein the dummy switch block has a layout replicating the layout of the switch block, and
- wherein the plurality of switch transistors included in the dummy switch block are fixed to be off-state.

13. The semiconductor device according to claim 9, wherein the differential input signals are a quasi-millimeter wave signal or a millimeter wave signal.

14. The semiconductor device according to claim 9, further comprising:
- a first variable gain amplifier including the first differential transistor, the second differential transistor, and the switch block, and amplifying the differential input signals having a predetermined phase with a gain corresponding to the parallel number of switches in the switch block;
- a second variable gain amplifier including the first differential transistor, the second differential transistor, and the switch block, and amplifying the differential input signals having a phase different from the predetermined phase by 90 degrees with a gain corresponding to the parallel number of switches in the switch block; and
- a synthesizer combining the differential output signals from the first variable gain amplifier and the differential output signals from the second variable gain amplifier.

15. A semiconductor device comprising:
- a semiconductor substrate having a main surface;
- a plurality of wiring layers formed on the main surface;
- a first common wiring and a second common wiring arranged side by side in the first direction in the plan view in the plurality of wiring layers and extended in a second direction crossing the first direction in the plan view;
- a first differential input wiring and a second differential input wiring arranged in the plurality of wiring layers and transmitting differential input signals;
- a first differential transistor formed on the main surface such that a drain of which is coupled to the first common wiring and a gate of which is coupled to the first differential input wiring;
- a second differential transistor formed on the main surface such that a drain of which is coupled to the second common wiring and a gate of which is coupled to the second differential input wiring;
- an output wiring pair transmitting differential output signals and comprised of a first output wiring and a second output wiring arranged side by side in the first direction in the plan view in the plurality of wiring layers and extended in the second direction in the plan view; and
- a switch block that can variably set a parallel number of the switch transistors used for coupling, and including a first switch unit and a second switch unit arranged next to each other in the second direction in the plan view, each including a plurality of switch transistors for selecting a forward coupling state in which the first output wiring and the second output wiring are coupled to the first output wiring and the second output wiring respectively or a cross coupling state in which the first common wiring and the second common wiring are coupled to the second output wiring and the first output wiring, respectively,
- wherein at least one of the first output wiring and the second output wiring has a first section arranged adjacent to the first common wiring at a first interval in the first direction and is not arranged adjacent to the second common wiring and a second section arranged adjacent to the second common wiring at the first interval in the first direction and is not arranged next to the first common line.

16. The semiconductor device according to claim 15, wherein the other of the first output wiring or the second output wiring has the first section and the second section.

17. The semiconductor device according to claim 15,
- wherein the first section and the second section are alternately arranged in the second direction, and
- wherein the length of the first section and the length of the second section are the same.

18. The semiconductor device according to claim 17,
- wherein each of the first and second switch units comprises:
- a first switch transistor and a second switch transistor which are turned on in the forward coupling state; and
- a third switch transistor and a fourth switch transistor which are turned on in the cross coupling state,
- wherein the first section and the second section are interchanged between neighboring switch units.

19. The semiconductor device according to claim 18,
- wherein the switch block includes a plurality of switch units including the first and second switch units,
- wherein the plurality of switch units are divided into $2^k$ (k=0, 1, . . . ) control units, wherein the number of the switch transistors in the switch blocks is set by combining the control units, and
- wherein the first section and the second section are switched for each of the switch units.

20. The semiconductor device according to claim 15, wherein the differential input signals are a quasi-millimeter wave signals or millimeter wave signals.

* * * * *